United States Patent
Sakui et al.

(10) Patent No.: US 12,315,570 B2
(45) Date of Patent: *May 27, 2025

(54) SEMICONDUCTOR ELEMENT MEMORY DEVICE

(71) Applicant: Unisantis Electronics Singapore Pte. Ltd., Singapore (SG)

(72) Inventors: Koji Sakui, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 125 days.

This patent is subject to a terminal disclaimer.

(21) Appl. No.: 18/226,656

(22) Filed: Jul. 26, 2023

(65) Prior Publication Data

US 2023/0377658 A1    Nov. 23, 2023

Related U.S. Application Data

(63) Continuation-in-part of application No. PCT/JP2021/003248, filed on Jan. 29, 2021.

(51) Int. Cl.
*G11C 16/16* (2006.01)
*G11C 16/10* (2006.01)
*G11C 16/12* (2006.01)

(52) U.S. Cl.
CPC ............ *G11C 16/16* (2013.01); *G11C 16/102* (2013.01); *G11C 16/12* (2013.01)

(58) Field of Classification Search
CPC ....... G11C 16/16; G11C 16/102; G11C 16/12; G11C 5/025; G11C 8/12; G11C 11/409; G11C 11/404; H10B 12/00

(Continued)

(56) References Cited

U.S. PATENT DOCUMENTS 8,154,086 B2 * 4/2012 Masuoka ............. H10D 30/025
                                                        257/E27.098
12,205,629 B2 * 1/2025 Sakui ................. G11C 11/4094
(Continued)

FOREIGN PATENT DOCUMENTS

JP    H 02-188966 A    7/1990
JP    H 03-171768 A    7/1991
(Continued)

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, vol. 38, No. 3, pp. 573-578 (1991).

(Continued)

*Primary Examiner* — Alexander Sofocleous
*Assistant Examiner* — James S Wells
(74) *Attorney, Agent, or Firm* — Crowell & Moring LLP

(57) ABSTRACT

A semiconductor-element-including semiconductor memory device includes a block in which a plurality of memory cells CL00 to CL13 are arranged in a matrix, in which a data retention operation is performed in which voltages applied to plate lines PL0 and PL1, word lines WL0 and WL1, a source line SL, and bit lines BL0 to BL3 are controlled to retain a group of positive holes, generated by an impact ionization phenomenon or a gate-induced drain leakage current, inside a semiconductor body, and a data erase operation is performed in which the voltages applied to the plate lines PL0 and PL1, the word lines WL0 and WL1, the source line SL, and the bit lines BL0 to BL3 are controlled to discharge the group of positive holes from inside the semiconductor body and the voltage of the semiconductor body is lowered with capacitive coupling with the plate lines PL0 and PL1 and capacitive coupling with the word lines (Continued)

WL0 and WL1. For the memory cells in the block, one or both of a memory re-write operation for the memory cells CL00, CL02, CL03, CL11, and CL13 that are in a state of the data retention operation and a memory re-erase operation for the memory cells CL01, CL10, and CL12 in a state of the data erase operation are performed for all of the memory cells in the block simultaneously.

9 Claims, 20 Drawing Sheets

(58) Field of Classification Search
USPC .................................................. 365/185.29
See application file for complete search history.

(56) References Cited

U.S. PATENT DOCUMENTS

| | | |
|---|---|---|
| 2003/0111681 A1 | 6/2003 | Kawanaka |
| 2006/0049444 A1 | 3/2006 | Shino |
| 2008/0137394 A1 | 6/2008 | Shimano |
| 2008/0212366 A1 | 9/2008 | Ohsawa |

FOREIGN PATENT DOCUMENTS

| | | |
|---|---|---|
| JP | 2006-080280 A | 3/2006 |
| JP | 3957774 B2 | 8/2007 |
| JP | 2008-218556 A | 9/2008 |

OTHER PUBLICATIONS

H. Chung, H. Kim, H. Kim, K. Kim, S. Kim, K. Dong, J. Kim, Y. C. Oh, Y. Hwang, H. Hong, G. Jin, and C. Chung: "Novel 4F2 DRAM Cell with Vertical Pillar Transistor (VPT)," 2011 Proceeding of the European Solid-State Device Research Conference, (2011).

H. S. Philip Wong, S. Raoux, S. Kim, Jiale Liang, J. R. Reifenberg, B. Rajendran, M. Asheghi and K. E. Goodson: "Phase Change Memory," Proceeding of IEEE, vol. 98, No. 12, December, pp. 2201-2227 (2010).

T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and high Speed Switching of Ti-doped NiO ReRAM under the Unipolar Voltage Source of less than 3V," IEDM (2007).

W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015).

M. G. Ertosum, K. Lim, C. Park, J. Oh, P. Kirsch, and K. C. Saraswat: "Novel Capacitorless Single-Transistor Charge-Trap DRAM (1T CT DRAM) Utilizing Electron," IEEE Electron Device Letter, vol. 31, No. 5, pp. 405-407 (2010).

J. Wan, L. Rojer, A. Zaslavsky, and S. Critoloveanu: "A Compact Capacitor-Less High-Speed DRAM Using Field Effect-Controlled Charge Regeneration," Electron Device Letters, vol. 35, No. 2, pp. 179-181 (2012).

T. Ohsawa, K. Fujita, T. Higashi, Y. Iwata, T. Kajiyama, Y. Asao, and K. Sunouchi: "Memory design using a one-transistor gain cell on SOI," IEEE JSSC, vol. 37, No. 11, pp. 1510-1522 (2002).

T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32nm Node and Beyond," IEEE IEDM (2006).

E. Yoshida and T. Tanaka: "A Design of a Capacitorless 1T-DRAM Cell Using Gate-induced Drain Leakage (GIDL) Current for Low-power and High-speed Embedded Memory," IEEE IEDM, pp. 913-916, Dec. 2003.

J. Y. Song, W. Y. Choi, J. H. Park, J. D. Lee, and B-G. Park: "Design Optimization of Gate-All-Around (GAA) MOSFETs," IEEE Trans. Electron Devices, vol. 5, No. 3, pp. 186-191, May 2006.

N. Loubet, et al.: "Stacked Nanosheet Gate-All-Around Transistor to Enable Scaling Beyond FinFET," 2017 IEEE Symposium on VLSI Technology Digest of Technical Papers, T17-5, T230-T231, Jun. 2017.

H. Jiang, N. Xu, B. Chen, L. Zeng1, Y. He, G. Du, X. Liu and X. Zhang: "Experimental investigation of self heating effect (SHE) in multiple-fin SOI F inFETs," Semicond. Sci. Technol. 29 (2014) 115021 (7 pp).

E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, vol. 53, No. 4, pp. 692-697, Apr. 2006.

F. Morishita, H. Noda, I. Hayashi, T. Gyohten, M. Oksmoto, T. Ipposhi, S. Maegawa, K. Dosaka, and K. Arimoto: "A Capacitorless Twin-Transistor Random Access Memory (TTRAM) on SOI," IEICE Trans. Electron., vol. E90-c., No. 4 pp. 765-771 (2007).

International Search Report (PCT/ISA/210) (Japanese) from PCT/JP2021/003248 dated March 30, 2021, 3 pgs.

English translation of International Search of Search Report (PCT/ISA/210) of PCT/JP2021/003248, 2 pgs.

Written Opinion (PCT/ISA/237) (Japanese) of PCT/JP2021/003248 dated Mar. 3, 2021, 3pgs.

F. Morishita, H. Noda, I. Hayashi, T. Gyohten, M. Okamoto, T. Ipposhi, S. Maegawa, K. Dosaka, and K. Arimoto: "A Capacitorless Twin-Transistor Random Access Memory (TTRAM) on SOI," IEICE Trans. Electron., vol. E90-c., No. 4 pp. 765-771 (2007) a brief description attached.

* cited by examiner

FIG. 2A

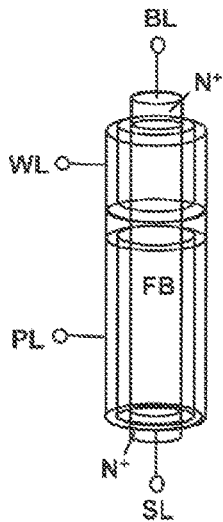

FIG. 2B

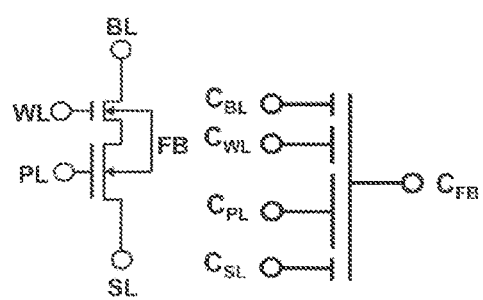

$$C_{FB} = C_{WL} + C_{PL} + C_{BL} + C_{SL} \quad (1)$$

$$\beta_{WL} = \frac{C_{WL}}{C_{WL} + C_{PL} + C_{BL} + C_{SL}} \quad (2) \implies \text{SMALL } \beta_{WL}$$

$$\beta_{PL} = \frac{C_{PL}}{C_{WL} + C_{PL} + C_{BL} + C_{SL}} \quad (3) \implies \text{LARGE } \beta_{PL}$$

$$\beta_{BL} = \frac{C_{BL}}{C_{WL} + C_{PL} + C_{BL} + C_{SL}} \quad (4) \implies \text{SMALL } \beta_{BL}$$

$$\beta_{SL} = \frac{C_{SL}}{C_{WL} + C_{PL} + C_{BL} + C_{SL}} \quad (5) \implies \text{SMALL } \beta_{SL}$$

FIG. 2C

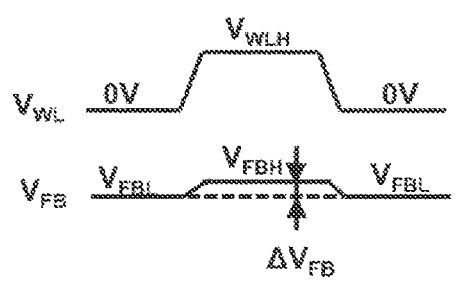

$$\Delta V_{FB} = V_{FBH} - V_{FBL}$$
$$= \underline{\beta_{WL} \times V_{WLH}} \quad (6)$$
$$\text{SMALL}$$

SUBSTANTIAL DRAIN $$V_{FB}"1" = Vb - \underline{\beta_{WL} \times VI_{WL}"1" - \beta_{BL} \times V_{BLH}} \quad (7)$$
SMALL

FIG. 4AA

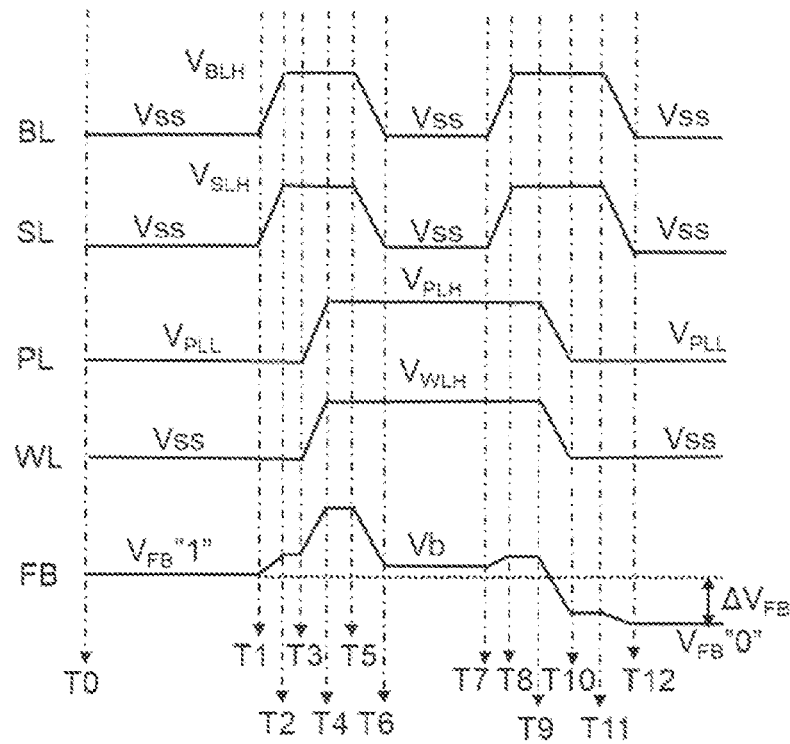

T3 TO T4: FIRST PERIOD
T5 TO 56: SECOND PERIOD
T9 TO T10: THIRD PERIOD

FIG. 4AB

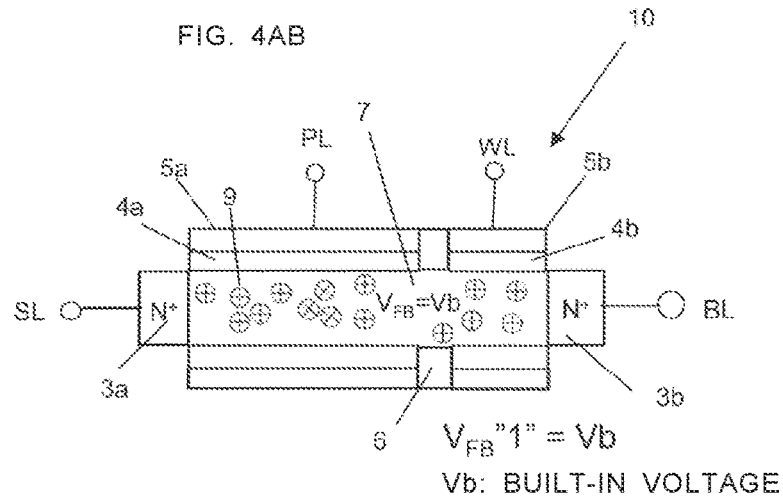

Vb: BUILT-IN VOLTAGE $$V_{FB}\text{"1"} = Vb - \beta_{WL} \times Vt_{WL}\text{"1"} - \beta_{BL} \times V_{BLH} \quad (7)$$

$$V_{FB}\text{"0"} = Vb - \beta_{WL} \times V_{WLH} - \beta_{PL} \times (V_{PLH} - V_{PLL}) \quad (8)$$

$$\begin{aligned}\Delta V_{FB} &= V_{FB}\text{"1"} - V_{FB}\text{"0"} \\ &= \beta_{WL} \times V_{WLH} + \beta_{PL} \times (V_{PLH} - V_{PLL}) \\ &\quad - \beta_{WL} \times Vt_{WL}\text{"1"} - \beta_{BL} \times V_{BLH} \quad (9)\end{aligned}$$

Vb: Built-in Voltage~0.7V

Vb: BUILT-IN VOLTAGE 0.7V $V_{FB}"1" \Rightarrow V_{FB}"1" - V\alpha$ $$\beta_{BL} = \frac{C_{BL}}{C_{WL} + C_{PL} + C_{BL} + C_{SL}} \quad (4)$$

$$V_{FB2} = V_{FB1} + \beta_{BL} \times V_{BLR} \quad (10)$$

$$Vb1 = Vb - \beta_{WL} \times Vt_{WL}\text{"1"} \quad (11)$$

$$V_{FB}\text{"1"} = Vb2 = Vb1 - \beta_{BL} \times V_{BLR}$$
$$= Vb - \beta_{WL} \times Vt_{WL}\text{"1"} - \beta_{BL} \times V_{BLR} \quad (12)$$

$$V_{FB}"0" \Rightarrow V_{FB}"0" + V_Y$$

$$V_{FB}\text{"0"} = Vb - \beta_{WL} \times V_{WLRE} - \beta_{PL} \times (V_{PLR} - V_{PLL}) \quad (13)$$

FIG. 8B

| SELECTED/NON-SELECTED | SIGNAL LINE | APPLIED VOLTAGE |
|---|---|---|
| "1" REFRESHED BLOCK | BIT LINE BL | $V_{ss} \Rightarrow V_{BLR}$ (e.g.: 3V) $\Rightarrow V_{ss}$ |
| | SOURCE LINE SL | $V_{ss}$ |
| | PLATE LINE PL | $V_{PLL}$ (e.g.: 2V) |
| | WORD LINE WL | $V_{ss}$ (e.g.: 0V) $\Rightarrow V_{WLRP}$ (e.g.: 4V) $\Rightarrow V_{ss}$ |
| | FLOATING BODY FB | $V_{FB}"1" - V\alpha \Rightarrow Vb \Rightarrow V_{FB}"1"$ |
| NON-REFRESHED BLOCK | BIT LINE BL | $V_{ss}$ (e.g.: 0V) |
| | SOURCE LINE SL | $V_{ss}$ (e.g.: 0V) |
| | PLATE LINE PL | $V_{PLL}$ (e.g.: 2V) |
| | WORD LINE WL | $V_{ss}$ (e.g.: 0V) |
| | FLOATING BODY FB | $V_{FB}"1"$ OR $V_{FB}"0"$ |

Vb: BUILT-IN VOLTAGE 0.7V

FIG. 8C

| SELECTED/NON-SELECTED | SIGNAL LINE | APPLIED VOLTAGE |
|---|---|---|
| "0" REFRESHED BLOCK | BIT LINE BL | $V_{ss}$ |
| | SOURCE LINE SL | $V_{ss}$ |
| | PLATE LINE PL | $V_{PLL}$ (e.g.: 2V) $\Rightarrow V_{PLR}$ (e.g.: 4V) $\Rightarrow V_{PLL}$ |
| | WORD LINE WL | $V_{ss}$ (e.g.: 0V) $\Rightarrow V_{WLRE}$ (e.g.: 4V) $\Rightarrow V_{ss}$ |
| | FLOATING BODY FB | $V_{FB}"0" + V\gamma \Rightarrow Vb \Rightarrow V_{FB}"1"$ |
| NON-REFRESHED BLOCK | BIT LINE BL | $V_{ss}$ (e.g.: 0V) |
| | SOURCE LINE SL | $V_{ss}$ (e.g.: 0V) |
| | PLATE LINE PL | $V_{PLL}$ (e.g.: 2V) |
| | WORD LINE WL | $V_{ss}$ (e.g.: 0V) |
| | FLOATING BODY FB | $V_{FB}"1"$ OR $V_{FB}"0"$ |

Vb: BUILT-IN VOLTAGE 0.7V

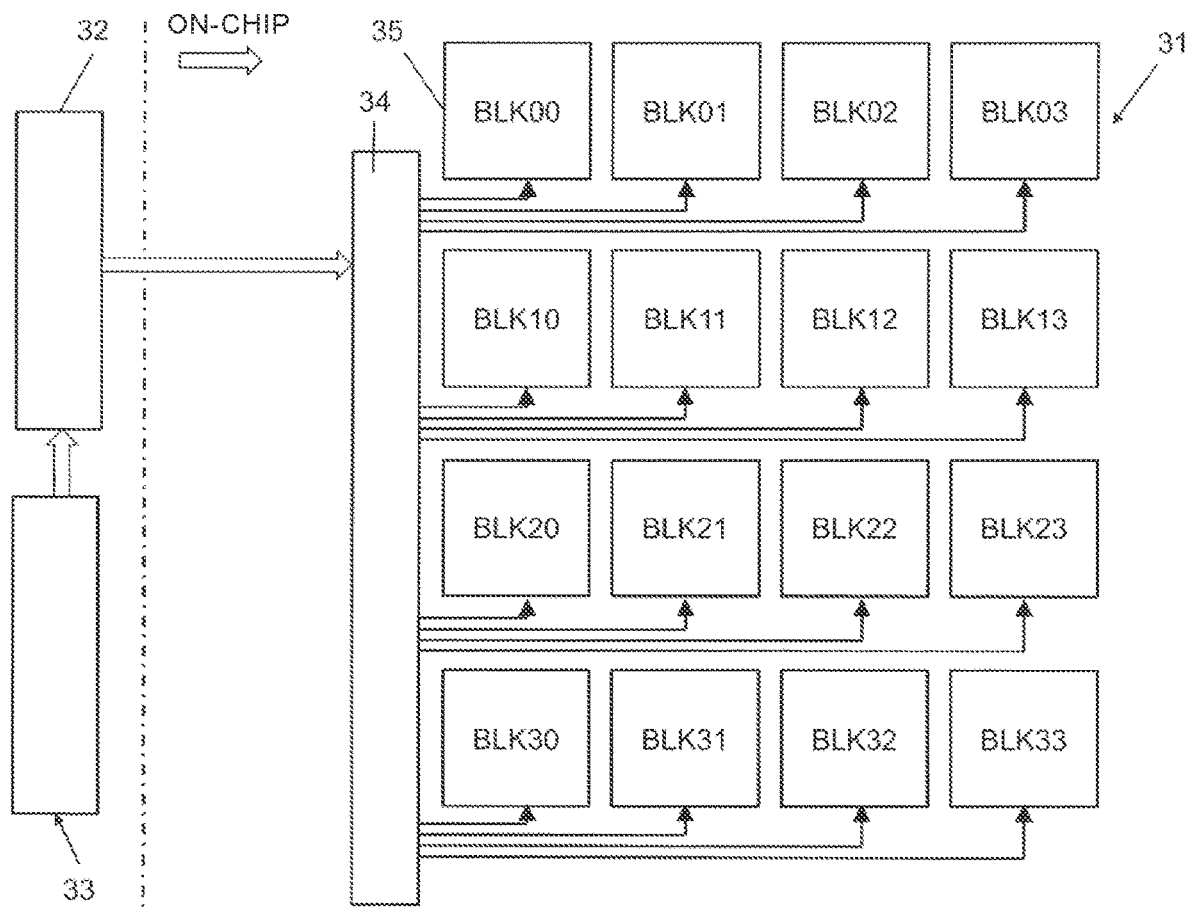

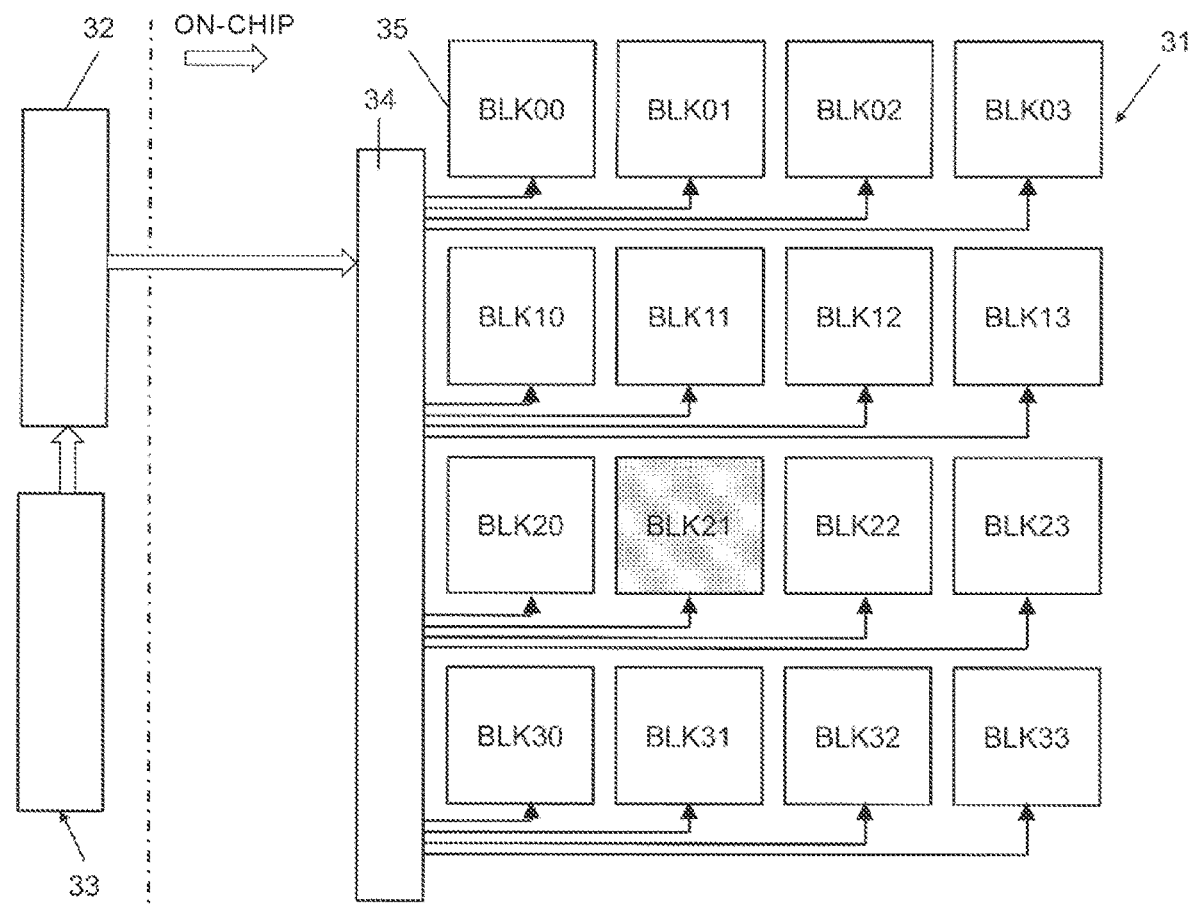

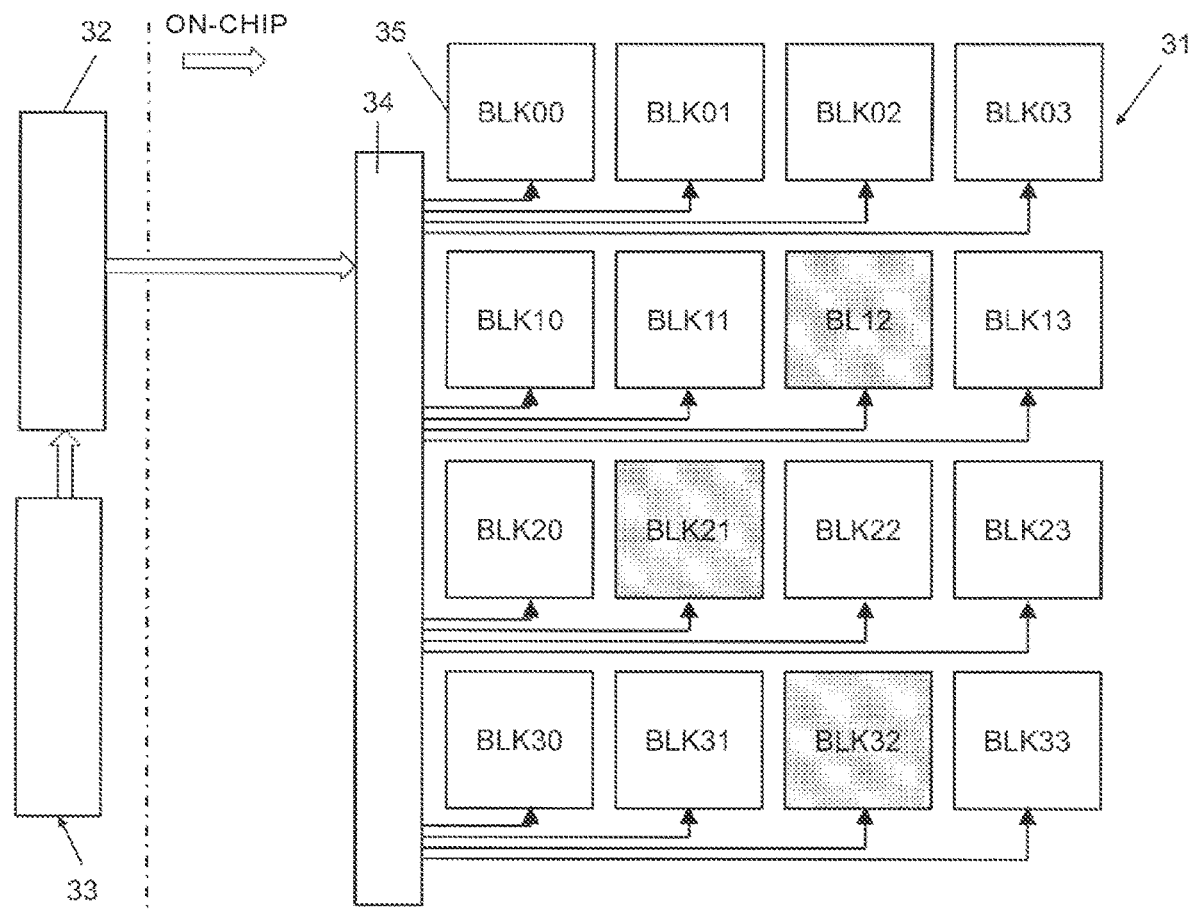

$$C_{FB} = C_{WL} + C_{BL} + C_{SL} \qquad (14)$$

$$\beta_{WL} = \frac{C_{WL}}{C_{WL} + C_{BL} + C_{SL}} \qquad (15)$$

$$\Delta V_{FB} = V_{FB2} - V_{FB1}$$
$$= \beta_{WL} \times V_{WLH} \qquad (16)$$

SEMICONDUCTOR ELEMENT MEMORY DEVICE

CROSS REFERENCES TO RELATED APPLICATIONS

The present application is a continuation-in-part application of PCT/JP2021/003248, filed Jan. 29, 2021, the entire contents of which are incorporated herein by reference,

BACKGROUND OF THE INVENTION

1. Field of the Invention

The present invention relates to a semiconductor-element-including semiconductor memory device.

2. Description of the Related Art

Recently, there has been a demand for highly integrated and high-performance memory elements in the development of LSI (Large Scale Integration) technology.

Typical planar MOS transistors include a channel that extends in a horizontal direction along the upper surface of the semiconductor substrate. In contrast, SGTs include a channel that extends in a direction perpendicular to the upper surface of the semiconductor substrate (see, for example, Japanese Unexamined Patent Application Publication No. 2-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)). Accordingly, the density of semiconductor devices can be made higher with SGTs than with planar MOS transistors. Such SGTs can be used as selection transistors to implement highly integrated memories, such as a DRAM (Dynamic Random Access Memory, see, for example, H. Chung, H. Kim, H. Kim, K. Kim, S. Kim, K. Dong, J. Kim, Y. C. Oh, Y. Hwang, H. Hong, G. Jin, and C. Chung: "4F2 DRAM Cell with Vertical Pillar Transistor (VPT)", 2011 Proceeding of the European Solid-State Device Research Conference, (2011)) to which a capacitor is connected, a PCM (Phase Change Memory, see, for example, H. S. Philip Wong, S. Raoux, S. Kim, Jiale Liang, J. R. Reifenberg, B. Rajendran, M. Asheghi and K. E. Goodson: "Phase Change Memory", Proceeding of IEEE, Vol. 98, No. 12, December, pp. 2201-2227 (2010)) to which a resistance change element is connected, an RRAM (Resistive Random Access Memory, see, for example, K. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and High Speed Switching of Ti-doped NiO ReRAM under the Unipolar Voltage Source of less than 3V", TEDM (2007)), and an MRAM (Magneto-resistive Random Access Memory, see, for example, W. Kang, L. Zhang, J. Klein, Y. Zhang, D. Ravelosona, and W. Zhao: "Reconfigurable Codesign of STT-MRAM Under Process Variations in Deeply Scaled Technology", IEEE Transaction on Electron Devices, pp. 1-9 (2015)) that changes the resistance by changing the orientation of a magnetic spin with a current. Further, there exists, for example, a DRAM memory cell (see Japanese Unexamined Patent Application Publication No. 3-171768 and M. G. Ertosum, K. Lim, C. Park, J. Oh, P. Kirsch, and K. C. Saraswat: "Novel Capacitorless Single-Transistor Charge-Trap DRAM (1T CT DRAM) Utilizing Electron", IEEE Electron Device Letter, Vol. 31, No. 5, pp. 405-407 (2010)) constituted by a single MOS transistor and including no capacitor. The present application relates to a dynamic flash memory that can be constituted only by a MOS transistor and that includes no resistance change element or capacitor.

FIGS. 11A, 11B, 11C and 11D illustrate a write operation of a DRAM memory cell constituted by a single MOS transistor and including no capacitor described above, FIGS. 12A and 12B illustrate a problem in the operation, and FIGS. 13A, 13B and 13C illustrate a read operation (see J. Wan, L. Rojer, A. Zaslavsky, and S. Critoloveanu: "A Compact Capacitor-Less High-Speed DRAM Using Field Effect-Controlled Charge Regeneration", Electron Device Letters, Vol. 35, No. 2, pp. 179-181 (2012), T. Ohsawa, K. Fujita, T. Higashi, Y. Iwata, T. Kajiyama, Y. Asao, and K. Sunouchi: "Memory design using a one-transistor gain cell on SOI", IEEE JSSC, vol. 37, No. 11, pp. 1510-1522 (2002), T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond", IEEE IEDM (2006); and E. Yoshida: "A Capacitorless 1T-DRAM Technology Using Gate-Induced Drain Leakage (GIDL) Current for Low-Power and High-Speed Embedded Memory", IEEE IEDM (2006)). FIG. 11A illustrates a "1" write state. Here, the memory cell is formed on an SOI substrate 100, is constituted by a source $N^+$ layer (hereinafter, a semiconductor region that contains a donor impurity in high concentrations is referred to as "$N^+$ layer") 103 to which a source line SL is connected, a drain $N^+$ layer 104 to which a bit line BL is connected, a gate conductor layer 105 to which a word line WL is connected, and a floating body 102 of a MOS transistor 110, and includes no capacitor. The single MOS transistor 110 constitutes the DRAM memory cell. Directly under the floating body 102, a $SiO_2$ layer 101 of the SOI substrate is in contact with the floating body 102. To write "1" to the memory cell constituted by the single MOS transistor 110, the MOS transistor 110 is operated in the saturation region. That is, a channel 107, for electrons, extending from the source $N^+$ layer 103 has a pinch-off point 108 and does not reach the drain $N^+$ layer 104 to which the bit line is connected. When a high voltage is applied to both of the bit line BL connected to the drain $N^+$ layer and the word line WL connected to the gate conductor layer 105, and the MOS transistor 110 is operated at the gate voltage that is about one-half of the drain voltage, the electric field intensity becomes maximum at the pinch-off point 108 that is in the vicinity of the drain $N^+$ layer 104. As a result, accelerated electrons that flow from the source $N^+$ layer 103 toward the drain $N^+$ layer 104 collide with the Si lattice, and with kinetic energy lost at the time of collision, electron-positive hole pairs are generated (impact ionization phenomenon). Most of the generated electrons (not illustrated) reach the drain $N^+$ layer 104. Further, a very small proportion of the electrons that are very hot pass through a gate oxide film 109 and reach the gate conductor layer 105. With positive holes 106 that are simultaneously generated, the floating body 102 is charged.

In this case, the generated positive holes contribute to an increase in the majority carriers because the floating body 102 is P-type Si. When the floating body 102 is filled with the generated positive holes 106 and the voltage of the floating body 102 becomes higher than that of the source $N^+$ layer 103 by Vb or more, further generated positive holes are discharged to the source $N^+$ layer 103. Here, Vb is the built-in voltage of the PN junction between the source $N^+$ layer 103 and the P-layer floating body 102 and is equal to about 0.7 V. FIG. 11B illustrates a state in which the floating body 102 is charged to saturation with the generated positive holes 106.

Now, a "0" write operation of the memory cell 110 will be described with reference to FIG. 11C. For the common selected word line WL, the memory cell 110 to which "1" is written and the memory cell 110 to which "0" is written are present at random. FIG. 11C illustrates a state of rewriting from a "1" write state to a "0" write state.

To write "0", the voltage of the bit line BL is set to a negative bias, and the PN junction between the drain $N^+$ layer 104 and the P-layer floating body 102 is forward biased. As a result, the positive holes 106 in the floating body 102 generated in advance in the previous cycle flow into the drain $N^+$ layer 104 that is connected to the bit line BL. When the write operation ends, the two memory cells are in a state in which the memory cell 110 (FIG. 11B) is filled with the generated positive holes 106, and from the memory cell 110 (FIG. 11C), the generated positive holes are discharged. The potential of the floating body 102 of the memory cell 110 filled with the positive holes 106 becomes higher than that of the floating body 102 in which generated positive holes are not present. Therefore, the threshold voltage of the memory cell 110 to which "1" is written becomes lower than the threshold voltage of the memory cell 110 to which "0" is written. This is illustrated in FIG. 11D.

Now, a problem in the operation of the memory cell constituted by the single MOS transistor 110 will be described with reference to FIGS. 12A and 12B. As illustrated in FIG. 12A, the capacitance $C_{FB}$ of the floating body is equal to the sum of the capacitance $C_{WL}$ between the gate to which the word line is connected and the floating body, the junction capacitance $C_{SL}$ of the PN junction between the source $N^+$ layer 103 to which the source line is connected and the floating body 102, and the junction capacitance $C_{BL}$ of the PN junction between the drain $N^+$ layer 104 to which the bit line is connected and the floating body 102 and is expressed as follows.

$$C_{FB}=C_{WL}+C_{BL}+C_{SL} \quad (14)$$

The capacitive coupling ratio $\beta_{WL}$ between the gate to which the word line is connected and the floating body is expressed as follows.

$$\beta_{WL}=C_{WL}/(C_{WL}+C_{BL}+C_{SL}) \quad (15)$$

Therefore, a change in the word line voltage $V_{WL}$ at the time of reading or writing affects the voltage of the floating body 102 that functions as a storage node (contact point) of the memory cell. This is illustrated in FIG. 12B. When the word line voltage $V_{WL}$ rises from 0 V to $V_{WLH}$ at the time of reading or writing, the voltage $V_{FB}$ of the floating body 102 rises from $V_{FB1}$, which is the voltage in the initial state before the word line voltage changes, to $V_{FB2}$ due to capacitive coupling with the word line. The voltage change amount $\Delta V_{FB}$ is expressed as follows.

$$\Delta V_{FB} = V_{FB2} - V_{FB1} \quad (16)$$
$$= \beta_{WL} \times V_{WLH}$$

Here, for $\beta_{WL}$ in expression (15), the contribution ratio of $C_{WL}$ is large and, for example, $C_{WL}:C_{BL}:C_{SL}=8:1:1$ holds. This results in $\beta_{WL}=0.8$. When the word line changes, for example, from 5 V at the time of writing to 0 V after the end of writing, the floating body 102 receives an amplitude noise of 5 V×$\beta_{WL}$=4 V due to capacitive coupling between the word line WL and the floating body 102. Accordingly, a sufficient margin is not provided to the potential difference between the "1" potential and the "0" potential of the floating body 102 at the time of writing, which has been a problem.

FIGS. 13A, 13B and 13C illustrate a read operation where FIG. 13A illustrates a "1" write state and FIG. 13B illustrates a "0" write state. In actuality, however, even when Vb is set for the floating body 102 to write "1", once the word line returns to 0 V at the end of writing, the floating body 102 is lowered to a negative bias. When "0" is written, the floating body 102 is lowered to a further negative bias, and it is difficult to provide a sufficiently large margin to the potential difference between "1" and "0" at the time of writing as illustrated in FIG. 13C. Therefore, there has been difficulty in commercially introducing DRAM memory cells actually including no capacitor.

SUMMARY OF THE INVENTION

In capacitor-less single-transistor DRAMs (gain cells), capacitive coupling between the word line and the floating body is strong. When the potential of the word line is changed at the time of data reading or at the time of data writing, the change is directly transmitted to the floating body as noise, which has been a problem. This causes a problem of erroneous reading or erroneous rewriting of storage data, and it has been difficult to commercially introduce capacitor-less single-transistor DRAMs (gain cells).

To address the above-described problems, a semiconductor element memory device according to the present invention includes a block constituted by a plurality of memory cells arranged in a matrix on a substrate, each of the memory cells included in the block including:
  a semiconductor body that stands on the substrate in a vertical direction relative to the substrate or that extends along the substrate in a horizontal direction relative to the substrate;
  a first impurity region and a second impurity region that are disposed at respective ends of the semiconductor body;
  a gate insulator layer that is in contact with a side surface of the semiconductor body between the first impurity region and the second impurity region;
  a first gate conductor layer that partially or entirely covers the gate insulator layer; and
  a second gate conductor layer that is adjacent to the first gate conductor layer and that is in contact with a side surface of the gate insulator layer, in which
in each of the memory cells,
voltages applied to the first gate conductor layer, the second gate conductor layer, the first impurity region, and the second impurity region are controlled to retain a group of positive holes, generated by an impact ionization phenomenon or a gate-induced drain leakage current, inside the semiconductor body,
a memory write operation is performed in which a voltage of the semiconductor body is made equal to a first data retention voltage that is higher than the voltage of one of the first impurity region or the second impurity region or the voltages of both of the first impurity region and the second impurity region by a built-in voltage,
a memory erase operation is performed in which the voltage of the semiconductor body is controlled so as to be higher than the first data retention voltage with first capacitive coupling between the first gate conductor layer and the semiconductor body and second capacitive coupling between the second gate conductor layer and the semiconductor body, and a group of remaining positive holes among the group of positive holes are discharged from inside the semiconductor body through one or both of the first impurity region and the second impurity region until the voltage of the semiconductor body becomes equal to a voltage higher than the voltage of one of the first impurity region or the second impurity region or the voltages of both of the first impurity region and the second impurity region by the built-in voltage, and in which the voltage of the semiconductor body is made equal to a second data retention voltage lower than the first data retention voltage with the first capacitive coupling and the second capacitive coupling, the voltage of the semiconductor body in each of the plurality of memory cells in the block is equal to the first data retention voltage or the second data retention voltage at a first time, at a second time after a lapse of time since the first time, a memory re-write operation is performed for the semiconductor body, in the block, that is at a voltage equal to the first data retention voltage at the first time to return the voltage of the semiconductor body to a voltage close to the first data retention voltage, and at a third time after a lapse of time since the first time, a memory re-erase operation is performed for the semiconductor body, in the block, that is at a voltage equal to the second data retention voltage at the first time to return the voltage of the semiconductor body to a voltage close to the second data retention voltage (first invention).

In the first invention described above, the voltage of the first gate conductor layer is increased from a first voltage to a second voltage higher than the first voltage, and the voltage of the second gate conductor layer is increased from a third voltage to a fourth voltage higher than the third voltage, the memory re-erase operation is performed over a first period, a second period, and a third period, in the first period, the voltage of the semiconductor body is controlled so as to be higher than the voltage at the first time with the first capacitive coupling and the second capacitive coupling, in the second period, the group of remaining positive holes among the group of positive holes are discharged from inside the semiconductor body through one or both of the first impurity region and the second impurity region until the voltage of the semiconductor body becomes equal to a voltage higher than the voltage of one of the first impurity region or the second impurity region or the voltages of both of the first impurity region and the second impurity region by the built-in voltage, and in the third period, the voltage of the semiconductor body is made equal to a voltage close to the second data retention voltage lower than the first data retention voltage with the first capacitive coupling and the second capacitive coupling (second invention).

In the second invention described above, the voltage of the first gate conductor layer is increased from the first voltage to the second voltage in increments of a first step voltage in at least two steps, the voltage of the second gate conductor layer is increased from the third voltage to the fourth voltage in increments of a second step voltage in at least two steps, and the memory re-erase operation is performed (third invention).

In the first invention described above, in the memory re-write operation, an inversion layer is formed in the semiconductor body, in the same block, that is at a voltage equal to the first data retention voltage at the first time, and the semiconductor body is kept at a voltage close to the first data retention voltage (fourth invention).

In the first invention described above, in the memory re-erase operation, in the semiconductor body, in the same block, that is at a voltage equal to the second data retention voltage at the first time, a current does not flow between the first impurity region and the second impurity region, and the semiconductor body is kept at a voltage close to the second data retention voltage (fifth invention).

In the first invention described above, a first gate capacitance between the first gate conductor layer and the semiconductor body is larger than a second gate capacitance between the second gate conductor layer and the semiconductor body (sixth invention).

A semiconductor element memory device includes a group of blocks that are a plurality of blocks each of which is the block of the semiconductor element memory device in the first to sixth inventions described above, in which the first impurity region is connected to a source line, the second impurity region is connected to a bit line, one of the first gate conductor layer or the second gate conductor layer is connected to a word line, and the other of the first gate conductor layer or the second gate conductor layer is connected to a first driving control line, the source line is connected to the semiconductor bodies in each of the blocks, and voltages are applied to the source line, the bit line, the first driving control line, and the word line to perform one of the memory re-write operation or the memory re-erase operation for all of the semiconductor bodies in a block selected from among the group of blocks or simultaneously perform both of the memory re-write operation and the memory re-erase operation for all of the semiconductor bodies in respective blocks selected from among the group of blocks (seventh invention).

In the first invention described above, one or both of the first gate conductor layer and the second gate conductor layer is divided into two or more isolated gate conductor layers in plan view or in the vertical direction, and the isolated gate conductor layers are operated synchronously or asynchronously (eighth invention).

In the eighth invention described above, in the vertical direction, the isolated gate conductor layers obtained from one of the first gate conductor layer or the second gate conductor layer are disposed on respective sides of the other of the first gate conductor layer or the second gate conductor layer (ninth invention).

BRIEF DESCRIPTION OF THE DRAWINGS

FIGS. 2A, 2B and 2C are diagrams for explaining an effect attained in a case where the gate capacitance of a first gate conductor layer $5a$ connected to a plate line PL is made larger than the gate capacitance of a second gate conductor layer $5b$ to which a word line WL is connected in the SGT-including memory device according to the first embodiment;

FIGS. 4AA and 4AB are diagrams for explaining a mechanism of an erase operation of the SGT-including memory device according to the first embodiment;

FIG. 8B is a table showing applied voltages of main nodes for explaining the block refresh operation of the SGT-including memory device according to the second embodiment;

FIG. 8C is a table showing applied voltages of the main nodes for explaining the block refresh operation of the SGT-including memory device according to the second embodiment;

FIG. 9A is a circuit block diagram of a memory array for explaining a block refresh operation of the SGT-including memory device according to a third embodiment;

FIG. 9B is a circuit block diagram of the memory array for explaining the block refresh operation of the SGT-including memory device according to the third embodiment;

FIG. 9C is a circuit block diagram of the memory array for explaining the block refresh operation of the SGT-including memory device according to the third embodiment;

DESCRIPTION OF THE PREFERRED EMBODIMENTS

Hereinafter, a semiconductor-element-including memory device (hereinafter called a dynamic flash memory) according to the present invention will be described with reference to the drawings.

First Embodiment

The structure and operation mechanisms of a dynamic flash memory cell according to a first embodiment of the present invention will be described with reference to FIG. 1 to FIGS. 7AA, 7AB, 7BC and 7BD. The structure of the dynamic flash memory cell will be described with reference to FIG. 1. An effect attained in a case where the gate capacitance of a first gate conductor layer 5a connected to a plate line PL is made larger than the gate capacitance of a second gate conductor layer 5b to which a word line WL is connected will be described with reference to FIGS. 2A, 2B and 2C. A mechanism of a data write operation will be described with reference to FIGS. 3A, 3B, 3C and 3D, a mechanism of a data erase operation will be described with reference to FIGS. 4AA, 4AB, 4BC, 4BD and 4BE, and a mechanism of a data read operation will be described with reference to FIGS. 5A, 5B and 5C. A block refresh operation for a "1" write state will be described with reference to FIGS. 6AA, 6AB, 6BC and 6BD, and a block refresh operation for a "0" erase state will be described with reference to FIGS. 7AA, 7AB, 7BC and 7BD.

Figure 1:
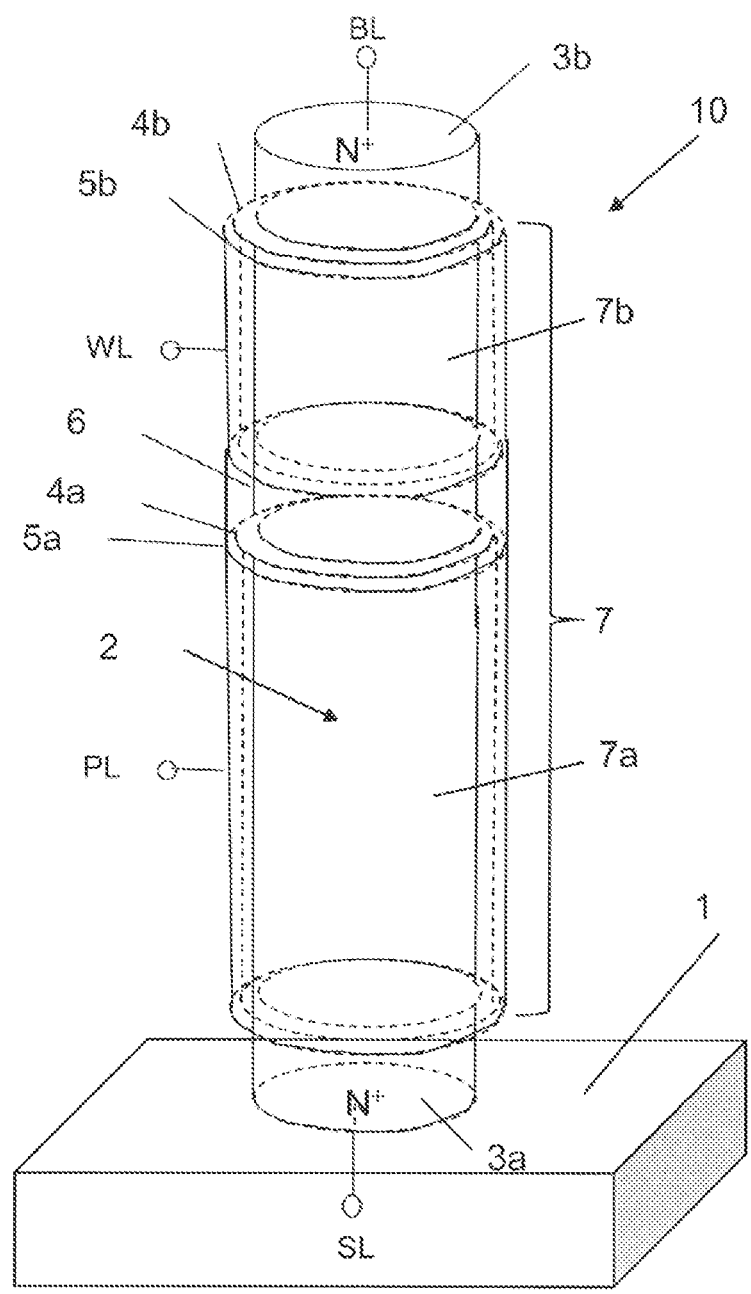
FIG. 1 is a structural diagram of an SGT-including memory device according to a first embodiment.

FIG. 1 illustrates the structure of the dynamic flash memory cell according to the first embodiment of the present invention. On the top and the bottom of a silicon semiconductor column 2 (the silicon semiconductor column is hereinafter referred to as "Si column") (which is an example of "semiconductor body" in the claims) of the P or i (intrinsic) conductivity type formed on a substrate 1 (which is an example of "substrate" in the claims), N$^+$ layers 3a and 3b (which are examples of "first impurity region" and "second impurity region" in the claims), one of which functions as the source and the other functions as the drain, are formed respectively. The part of the Si column 2 between the N$^+$ layers 3a and 3b that function as the source and the drain functions as a semiconductor body 7 (which is an example of "semiconductor body" in the claims). Around the semiconductor body 7, a first gate insulator layer 4a (which is an example of "gate insulator layer" in the claims) and a second gate insulator layer 4b (which is an example of "gate insulator layer" in the claims) are formed.

The first gate insulator layer 4a and the second gate insulator layer 4b are in contact with or in close vicinity to the N$^+$ layers 3a and 3b that function as the source and the drain respectively. Around the first gate insulator layer 4a and the second gate insulator layer 4b, the first gate conductor layer 5a (which is an example of "first gate conductor layer" in the claims) and the second gate conductor layer 5b (which is an example of "second gate conductor layer" in the claims) are formed respectively. The first gate conductor layer 5a and the second gate conductor layer 5b are isolated from each other by an insulating layer 6 (which is also referred to as "first insulating layer").

The semiconductor body 7, which is the part of the Si column 2 between the N$^+$ layers 3a and 3b, is constituted by a first channel Si layer 7a (which is also referred to as "first semiconductor body") surrounded by the first gate insulator layer 4a and a second channel Si layer 7b (which is also referred to as "second semiconductor body") surrounded by the second gate insulator layer 4b. Accordingly, the N⁺ layers 3a and 3b that function as the source and the drain, the semiconductor body 7, the first gate insulator layer 4a, the second gate insulator layer 4b, the first gate conductor layer 5a, and the second gate conductor layer 5b constitute a dynamic flash memory cell 10. The N⁺ layer 3a that functions as the source is connected to a source line SL (which is an example of "source line" in the claims), the N⁺ layer 3b that functions as the drain is connected to a bit line BL (which is an example of "bit line" in the claims), the first gate conductor layer 5a is connected to the plate line PL, which is a first driving control line (which is an example of "first driving control line" in the claims), and the second gate conductor layer 5b is connected to the word line WL (which is an example of "word line" in the claims). Desirably, the dynamic flash memory cell has a structure in which the gate capacitance of the first gate conductor layer 5a to which the plate line PL is connected is larger than the gate capacitance of the second gate conductor layer 5b to which the word line WL is connected.

In FIG. 1, to make the gate capacitance of the first gate conductor layer 5a connected to the plate line PL larger than the gate capacitance of the second gate conductor layer 5b to which the word line WL is connected, the gate length of the first gate conductor layer 5a is made longer than the gate length of the second gate conductor layer 5b. Alternatively, instead of making the gate length of the first gate conductor layer 5a longer than the gate length of the second gate conductor layer 5b, the thicknesses of the respective gate insulator layers may be made different such that the thickness of the gate insulating film of the first gate insulator layer 4a is thinner than the thickness of the gate insulating film of the second gate insulator layer 4b. Alternatively, the dielectric constants of the materials of the respective gate insulator layers may be made different such that the dielectric constant of the gate insulating film of the first gate insulator layer 4a is higher than the dielectric constant of the gate insulating film of the second gate insulator layer 4b. The gate capacitance of the first gate conductor layer 5a connected to the plate line PL may be made larger than the gate capacitance of the second gate conductor layer 5b to which the word line WL is connected, by a combination of any of the lengths of the gate conductor layers 5a and 5b and the thicknesses and dielectric constants of the gate insulator layers 4a and 4b.

FIGS. 2A, 2B and 20 are diagrams for explaining an effect attained in a case where the gate capacitance of the first gate conductor layer 5a connected to the plate line PL is made larger than the gate capacitance of the second gate conductor layer 5b to which the word line WL is connected.

FIG. 2A is a simplified structural diagram of the dynamic flash memory cell according to the first embodiment of the present invention and illustrates only main parts.

To the dynamic flash memory cell, the bit line BL, the word line WL, the plate line PL, and the source line SL are connected, and the potential state of the semiconductor body 7 is determined by the voltage states of the lines.

FIG. 2B is a diagram for explaining the capacitance relationships of the respective lines. The capacitance $C_{FB}$ of the semiconductor body 7 is equal to the sum of the capacitance $C_{WL}$ between the second gate conductor layer 5b to which the word line WL is connected and the semiconductor body 7, the capacitance $C_{PL}$ between the first gate conductor layer 5a to which the plate line PL is connected and the semiconductor body 7, the junction capacitance $C_{SL}$ of the PN junction between the source N⁺ layer 3a to which the source line SL is connected and the semiconductor body 7, and the junction capacitance $C_{BL}$ of the PN junction between the drain N⁺ layer 3b to which the bit line BL is connected and the semiconductor body 7, and is expressed as follows.

$$C_{FB}=C_{WL}+C_{PL}+C_{BL}+C_{SL} \tag{1}$$

Therefore, the coupling ratio $\beta_{WL}$ between the word line WL and the semiconductor body 7, the coupling ratio $\beta_{PL}$ between the plate line PL and the semiconductor body 7, the coupling ratio $\beta_{BL}$ between the bit line BL and the semiconductor body 7, and the coupling ratio $\beta_{SL}$ between the source line SL and the semiconductor body 7 are expressed as follows.

$$\beta_{WL}=C_{WL}/(C_{WL}+C_{PL}+C_{BL}+C_{SL}) \tag{2}$$

$$\beta_{PL}=C_{PL}/(C_{WL}+C_{PL}+C_{BL}+C_{SL}) \tag{3}$$

$$\beta_{BL}=C_{BL}/(C_{WL}+C_{PL}+C_{BL}+C_{SL}) \tag{4}$$

$$\beta_{SL}=C_{SL}/(C_{WL}+C_{PL}+C_{BL}+C_{SL}) \tag{5}$$

Here, $C_{PL}>C_{WL}$ holds, and therefore, this results in $\beta_{PL}>\beta_{WL}$.

FIG. 2C is a diagram for explaining a change in the voltage $V_{FB}$ of the semiconductor body 7 when the voltage $V_{WL}$ of the word line WL rises at the time of a read operation or a write operation and subsequently drops. Here, the potential difference $\Delta V_{FB}$ when the voltage $V_{FB}$ of the semiconductor body 7 transitions from a low-voltage state $V_{FBL}$ to a high-voltage state $V_{FBH}$ in response to the voltage $V_{WL}$ of the word line WL rising from 0 V to a high-voltage state $V_{WLH}$ is expressed as follows.

$$\begin{aligned}\Delta V_{FB} &= V_{FBH} - V_{FBL} \\ &= \beta_{WL} \times V_{WLH}\end{aligned} \tag{6}$$

The coupling ratio $\beta_{WL}$ between the word line WL and the semiconductor body 7 is small and the coupling ratio $\beta_{PL}$ between the plate line PL and the semiconductor body 7 is large, and therefore, $\Delta V_{FB}$ is small, and the voltage $V_{FB}$ of the semiconductor body 7 negligibly changes even when the voltage $V_{WL}$ of the word line WL changes at the time of a read operation or a write operation.

Figure 3A:
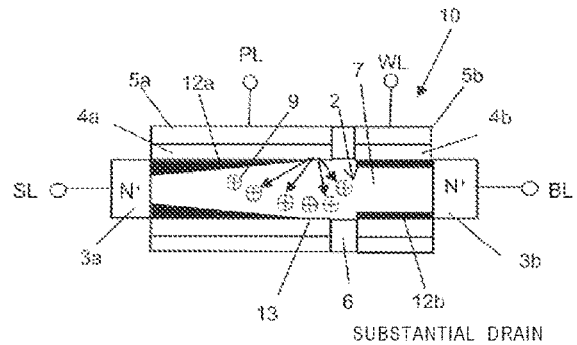
FIGS. 3A, 3B, 3C and 3D are diagrams for explaining a mechanism of a write operation of the SGT-including memory device according to the first embodiment.
Figure 3B:
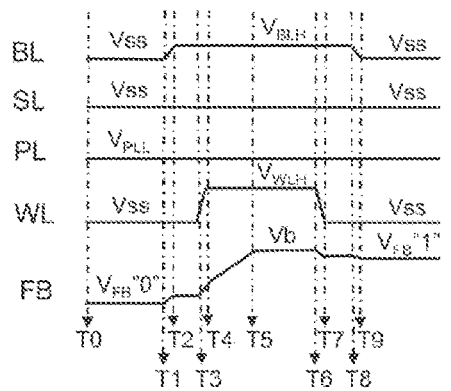

FIGS. 3A, 3B, 3C and 3D illustrate a write operation for the dynamic flash memory cell according to the first embodiment of the present invention. FIG. 3A illustrates a mechanism of the write operation, and FIG. 3B illustrates operation waveforms of the bit line BL, the source line SL, the plate line PL, the word line WL, and the semiconductor body 7 that functions as a floating body FB. At time T0, the dynamic flash memory cell is in a "0" erase state, and the voltage of the semiconductor body 7 is equal to $V_{FB}$"0". Vss is applied to the bit line BL, the source line SL, and the word line WL, and $V_{PLL}$ is applied to the plate line PL. Here, for example, Vss is equal to 0 V and $V_{PLL}$ is equal to 2 V. Subsequently, from time T1 to time T2, when the bit line BL rises from Vss to $V_{BLH}$, in a case where, for example, Vss is equal to 0 V, the voltage of the semiconductor body 7 becomes equal to $V_{FB}$"0"+$\beta_{BL} \times V_{BLH}$ due to capacitive coupling between the bit line BL and the semiconductor body 7.

The description of the write operation for the dynamic flash memory cell will be continued with reference to FIGS. 3A and 3B. From time T3 to time T4, the word line WL rises from Vss to $V_{WLH}$. Accordingly, when the threshold voltage for a "0" erase state of a second N-channel MOS transistor region that is a region in which the second gate conductor layer 5b to which the word line WL is connected surrounds the semiconductor body 7 is denoted by $Vt_{WL}$"0", as the voltage of the word line WL rises, in a range from Vss to $Vt_{WL}$"0", the voltage of the semiconductor body 7 becomes equal to $V_{FB}$="0"+$\beta_{WL} \times V_{BLH} \times \beta_{WL} \times Vt_{WL}$"0" due to second capacitive coupling (which is an example of "second capacitive coupling" in the claims) between the word line WL and the semiconductor body 7. When the word line WL rises to $Vt_{WL}$"0" or above, an inversion layer 12b in a ring form is formed in the semiconductor body 7 on the inner periphery of the second gate conductor layer 5b and interrupts the second capacitive coupling between the word line WL and the semiconductor body 7.

The description of the write operation for the dynamic flash memory cell will be continued with reference to FIGS. 3A and 3B. From time T3 to time T4, for example, a fixed voltage $V_{PLL}$=2 V is applied to the first gate conductor layer 5a to which the plate line PL is connected, and the second gate conductor layer 5b to which the word line WL is connected is raised to, for example, $V_{WLH}$=4 V. As a result, as illustrated in FIG. 3A, an inversion layer 12a in a ring form is formed in the semiconductor body 7 on the inner periphery of the first gate conductor layer 5a to which the plate line PL is connected, and a pinch-off point 13 is present in the inversion layer 12a. As a result, a first N-channel MOS transistor region including the first gate conductor layer 5a operates in the saturation region. In contrast, the second N-channel MOS transistor region including the second gate conductor layer 5b to which the word line WL is connected operates in the linear region. As a result, a pinch-off point is not present in the semiconductor body 7 on the inner periphery of the second gate conductor layer 5b to which the word line WL is connected, and the inversion layer 12b is formed on the entire inner periphery. The inversion layer 12b that is formed on the entire inner periphery of the second gate conductor layer 5b to which the word line WL is connected substantially functions as the drain of the first N-channel MOS transistor region. As a result, the electric field becomes maximum in a first boundary region of the semiconductor body 7 between the first N-channel MOS transistor region including the first gate conductor layer 5a and the second N-channel MOS transistor region including the second gate conductor layer 5b that are connected in series, and an impact ionization phenomenon occurs in this region. This region is a source-side region when viewed from the second N-channel MOS transistor region including the second gate conductor layer 5b to which the word line WL is connected, and therefore, this phenomenon is called a source-side impact ionization phenomenon. By this source-side impact ionization phenomenon, electrons flow from the N+ layer 3a to which the source line SL is connected toward the N+ layer 3b to which the bit line is connected. The accelerated electrons collide with lattice Si atoms, and electron-positive hole pairs are generated by the kinetic energy. Although some of the generated electrons flow into the first gate conductor layer 5a and into the second gate conductor layer 5b, most of the generated electrons flow into the N+ layer 3b to which the bit line BL is connected (not illustrated).

Figure 3C:
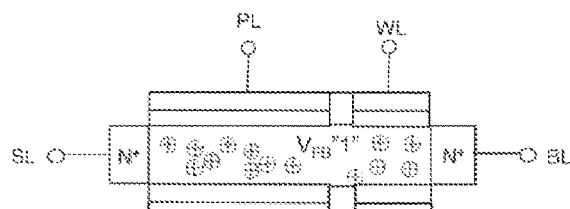

As illustrated in FIG. 3C, a generated group of positive holes 9 (which is an example of "group of positive holes" in the claims) are majority carriers in the semiconductor body 7, with which the semiconductor body 7 is charged to a positive bias. The N+ layer 3a to which the source line SL is connected is at 0 V, and therefore, the semiconductor body 7 is charged up to the built-in voltage Vb (about 0.7 V) of the PN junction between the N+ layer 3a to which the source line SL is connected and the semiconductor body 7. When the semiconductor body 7 is charged to a positive bias, the threshold voltages of the first N-channel MOS transistor region and the second N-channel MOS transistor region decrease due to a substrate bias effect.

The description of the write operation for the dynamic flash memory cell will be continued with reference to FIG. 3B. From time T6 to time T7, the voltage of the word line WL drops from $V_{WLH}$ to Vss. During this period, although the second capacitive coupling is formed between the word line WL and the semiconductor body 7, the inversion layer 12b interrupts the second capacitive coupling until the voltage of the word line WL drops from $V_{WLH}$ to a threshold voltage $Vt_{WL}$"1" of the second N-channel MOS transistor region or below when the voltage of the semiconductor body 7 is equal to Vb. Therefore, the capacitive coupling between the word line WL and the semiconductor body 7 is substantially formed only during a period from when the word line WL drops to $Vt_{WL}$"1" or below to when the word line WL drops to Vss. As a result, the voltage of the semiconductor body 7 becomes equal to Vb-$\beta_{WL} \times Vt_{WL}$"1". Here, $Vt_{WL}$"1" is lower than $Vt_{WL}$"0" described above, and $\beta_{WL} \times Vt_{WL}$"1" is small.

The description of the write operation for the dynamic flash memory cell will be continued with reference to FIG. 3B. From time T8 to time T9, the bit line BL drops from $V_{BLH}$ to Vss. The bit line BL and the semiconductor body 7 are capacitively coupled with each other, and therefore, the "1" write voltage $V_{FB}$"1" of the semiconductor body 7 becomes as follows at the end.

$$V_{FB}\text{"1"}=Vb-\beta_{WL} \times Vt_{WL}\text{"1"}-\beta_{WL} \times V_{BLH} \qquad (7)$$

Figure 3D:
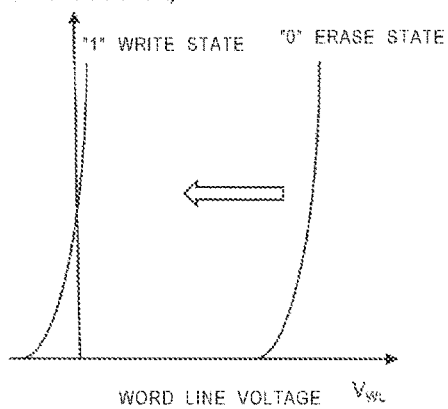

Here, the coupling ratio $\beta_{BL}$ between the bit line BL and the semiconductor body 7 is also small. Accordingly, as illustrated in FIG. 3D, the threshold voltage of the second N-channel MOS transistor region of the second semiconductor body 7b to which the word line WL is connected decreases. The memory write operation (which is an example of "memory write operation" in the claims) in which the voltage $V_{FB}$"1" in the "1" write state of the semiconductor body 7 is assumed to be a first data retention voltage (which is an example of "first data retention voltage" in the claims) is performed to assign logical storage data "1".

At the time of the write operation, electron-positive hole pairs may be generated by an impact ionization phenomenon in a second boundary region between the first impurity region 3a and the first semiconductor body 7a or in a third boundary region between the second impurity region 3b and the second semiconductor body 7b instead of the first boundary region, and the semiconductor body 7 may be charged with the generated group of positive holes 9.

A mechanism of an erase operation will be described with reference to FIGS. 4AA to 4BE. The semiconductor body 7 between the N+ layers 3a and 3b is electrically isolated from the substrate and functions as a floating body. FIG. 4AA is a timing operation waveform diagram of main nodes in the erase operation. In FIG. 4AA, T0 to T12 indicate times from the start to the end of the erase operation. FIG. 4AB illustrates a state at time T0 before the erase operation, in which the group of positive holes 9 generated by an impact ionization phenomenon in the previous cycle are stored in the semiconductor body 7. From time T1 to time T2, the bit line BL and the source line SL rise from Vss to $V_{BLH}$ and $V_{SLH}$ respectively and are in a high-voltage state. Here, Vss is, for example, equal to 0 V. With this operation, during the subsequent period, namely, a first period (which is an example of "first period" in the claims) from time T3 to time T4, the plate line PL rises from a first voltage (which is an example of "first voltage" in the claims) $V_{PLL}$ to a second voltage (which is an example of "second voltage" in the claims) $V_{PLH}$ and is in a high-voltage state, the word line WL rises from a third voltage (which is an example of "third voltage" in the claims) Vss to a fourth voltage (which is an example of "fourth voltage" in the claims) $V_{WLH}$ and is in a high-voltage state, and this prevents the inversion layer (which is an example of "inversion layer" in the claims) 12a on the inner periphery of the first gate conductor layer 5a to which the plate line PL is connected and the inversion layer (which is an example of "inversion layer" in the claims) 12b on the inner periphery of the second gate conductor layer 5b to which the word line WL is connected from being formed in the semiconductor body 7. Therefore, when the threshold voltage of the second N-channel MOS transistor region on the word line WL side and the threshold voltage of the first N-channel MOS transistor region on the plate line PL side are denoted by $V_{tWL}$ and $V_{tPL}$ respectively, it is desirable that the voltages $V_{BLH}$ and $V_{SLH}$ satisfy $V_{BLH} > V_{WLH} + V_{tWL}$ and $V_{SLH} > V_{PLH} + V_{tPL}$. For example, in a case where $V_{tWL}$ and $V_{tPL}$ are equal to 0.5 V, $V_{WLH}$ and $V_{PLA}$ need to be set to 3 V, and $V_{BLH}$ and $V_{SLH}$ need to be set to 3.5 V or higher.

The description of the mechanism of the erase operation illustrated in FIG. 4AA will be continued. As the plate line PL and the word line WL respectively rise to the second voltage $V_{PLH}$ and the fourth voltage $V_{WLH}$ and are in a high-voltage state during the first period from time T3 to time T4, the voltage of the semiconductor body 7 in a floating state is increased due to first capacitive coupling (which is an example of "first capacitive coupling" in the claims) between the plate line PL and the semiconductor body 7 and second capacitive coupling (which is an example of "second capacitive coupling" in the claims) between the word line WL and the semiconductor body 7. The voltage of the semiconductor body 7 rises from $V_{FB}$"1" in the "1" write state to a high voltage. This voltage rise is possible because the voltage of the bit line BL and that of the source line SL are high voltages of $V_{BLH}$ and $V_{SLH}$ respectively and the PN junction between the source N$^+$ layer 3a and the semiconductor body 7 and the PN junction between the drain N$^+$ layer 3b and the semiconductor body 7 are in a reverse bias state accordingly.

Figure 4B:
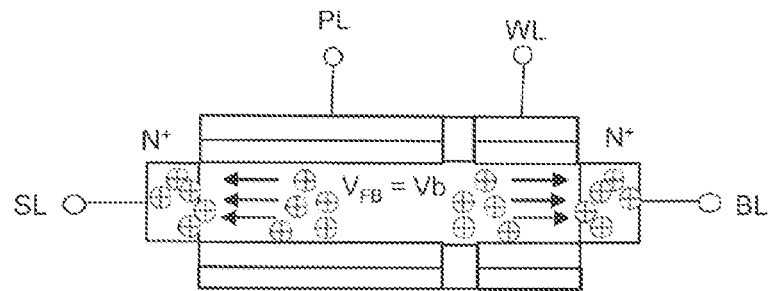
FIGS. 4BC, 4BD and 4BE are diagrams for explaining the mechanism of the erase operation of the SGT-including memory device according to the first embodiment.
Figure 4B:
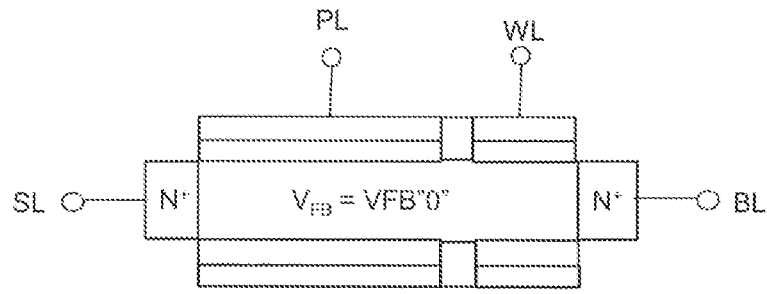
Figure 4B:
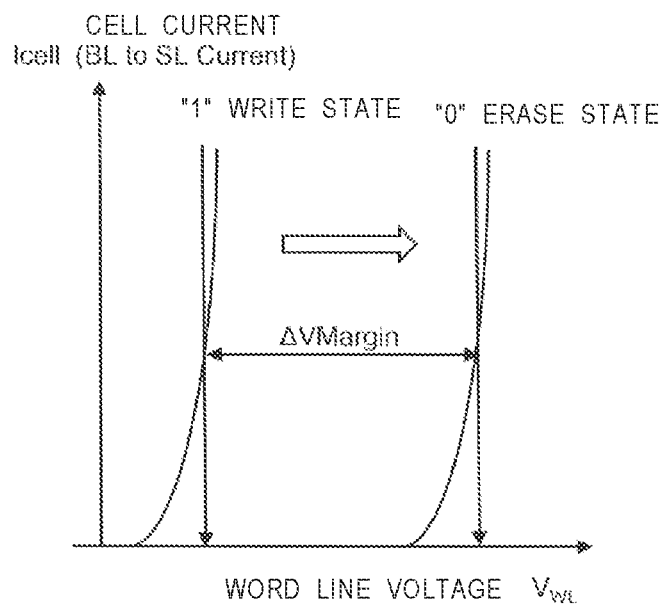

The description of the mechanism of the erase operation illustrated in FIG. 4AA will be continued. During the subsequent period, namely, a second period (which is an example of "second period" in the claims) from time T5 to time T6, the voltage of the bit line BL and that of the source line SL respectively drop from high voltages of $V_{BLH}$ and $V_{SLH}$ to Vss. As a result, the PN junction between the source N$^+$ layer 3a and the semiconductor body 7 and the PN junction between the drain N$^+$ layer 3b and the semiconductor body 7 are in a forward bias state as illustrated in FIG. 4BC, and a group of remaining positive holes (which is an example of "group of remaining positive holes" in the claims) among the group of positive holes 9 in the semiconductor body 7 are discharged to the source N$^+$ layer 3a and to the drain N$^+$ layer 3b. As a result, the voltage $V_{FB}$ of the semiconductor body 7 becomes equal to the built-in voltage Vb of the PN junction formed by the source N$^+$ layer 3a and the P-layer semiconductor body 7 and the PN junction formed by the drain N$^+$ layer 3b and the P-layer semiconductor body 7.

The description of the mechanism of the erase operation illustrated in FIG. 4AA will be continued. Subsequently, from time T7 to time T8, the voltage of the bit line BL and that of the source line SL rise from Vss to high voltages of $V_{BLH}$ and $V_{SLH}$ respectively. With this operation, as illustrated in FIG. 4BD, when the plate line PL drops from the second voltage $V_{PLH}$ to the first voltage $V_{PLL}$ and the word line WL drops from the fourth voltage $V_{WLH}$ to the third voltage Vss during a third period (which is an example of "third period" in the claims) from time T9 to time T10, the voltage $V_{FB}$ of the semiconductor body 7 efficiently changes from Vb to $V_{FB}$"0" due to the first capacitive coupling between the plate line PL and the semiconductor body 7 and the second capacitive coupling between the word line WL and the semiconductor body 7 without the inversion layer (which is an example of "inversion layer" in the claims) 12a on the plate line PL side or the inversion layer (which is an example of "inversion layer" in the claims) 12b on the word line WL side being formed in the semiconductor body 7. The voltage difference $\Delta V_{FB}$ of the semiconductor body 7 between the "1" write state and the "0" erase state is expressed by the following expressions.

$$V_{FB}"1" = Vb - \beta_{WL} \times Vt_{WL}"1" - \beta_{BL} \times V_{BLH} \quad (7)$$

$$V_{FB}"0" = Vb - \beta_{WL} \times V_{WLH} - \beta_{PL} \times (V_{PLH} - V_{PLL}) \quad (8)$$

$$\Delta V_{FB} = V_{FB}"1" - V_{FB}"0" \quad (9)$$
$$= \beta_{WL} \times V_{WLH} + \beta_{PL} \times (V_{PLH} - V_{PLL}) - \beta_{WL} \times Vt_{WL}"1" - \beta_{BL} \times V_{BLH}$$

Here, the sum of $\beta_{WL}$ and $\beta_{PL}$ is greater than or equal to 0.8, $\Delta V_{FB}$ is large, and a sufficient margin is provided. As a result, as illustrated in FIG. 4BE, a large margin is provided between the "1" write state and the "0" erase state.

The description of the mechanism of the erase operation illustrated in FIG. 4AA will be continued. During the subsequent period from time T11 to time T12, the voltage of the bit line BL drops from $V_{BLH}$ to Vss and that of the source line SL drops from $V_{SLH}$ to Vss, and the erase operation ends. At this time, although the bit line BL and the source line SL slightly decrease the voltage of the semiconductor body 7 due to capacitive coupling, this decrease is equal to the increase in the voltage of the semiconductor body 7 by the bit line BL and the source line SL from time T7 to time T8 due to capacitive coupling, and therefore, the decrease and the increase in the voltage by the bit line BL and the source line SL are canceled out, and the voltage of the semiconductor body 7 is not affected The memory erase operation (which is an Consequently. example of "memory erase operation" in the claims) in which the voltage $V_{FB}$"0" in the "0" erase state of the semiconductor body 7 is assumed to be a second data retention voltage (which is an example of "second data retention voltage" in the claims) is performed to assign logical storage data "0". When the voltage applied to the first gate conductor layer 5a connected to the plate line PL is set to a voltage higher than the threshold voltage at the time of logical storage data "1" and lower than the threshold voltage at the time of logical storage data "0" in data reading after the erase operation, a property that a current does not flow even when the voltage of the word line WL is increased can be attained.

Figure 5A:
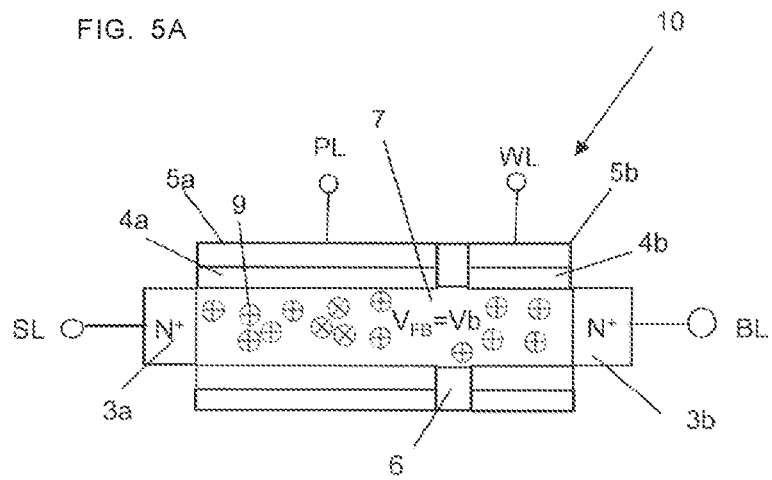
FIGS. 5A, 5B and 5C are diagrams for explaining a mechanism of a read operation of the SGT-including memory device according to the first embodiment.
Figure 5B:
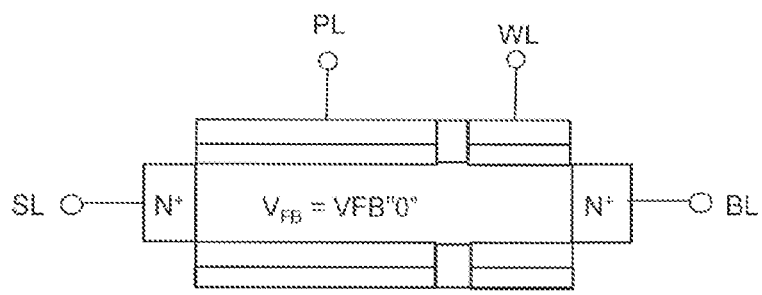
Figure 5C:
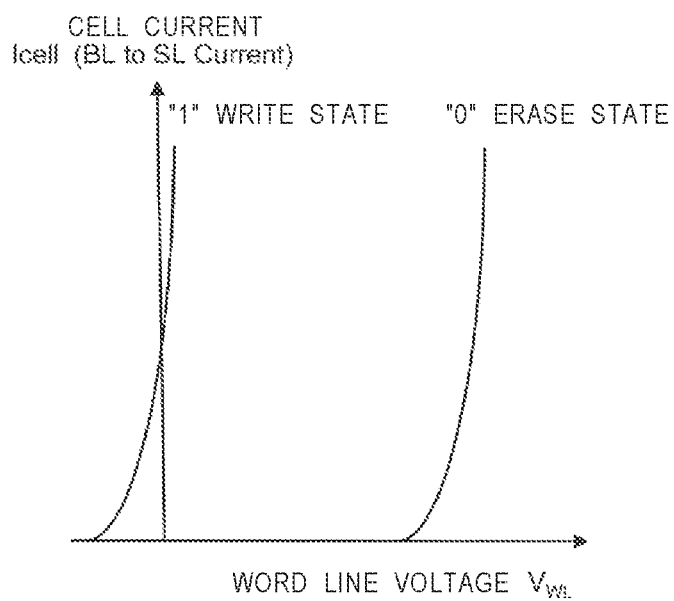

FIGS. 5A, 5B and 5C are diagrams for explaining a read operation for the dynamic flash memory cell according to the first embodiment of the present invention. As illustrated in FIG. 5A, when the semiconductor body 7 is charged up to the built-in voltage Vb (about 0.7 V), the threshold voltage of the second N-channel MOS transistor region including the second gate conductor layer 5b to which the word line WL is connected decreases due to a substrate bias effect. This state is assigned to logical storage data "1". As illustrated in FIG. 5B, a memory block selected before writing is in an erase state "0" in advance, and the voltage $V_{FB}$ of the semiconductor body 7 is equal to $V_{FB}$"0". With a write operation, a write state "1" is stored at random. As a result, logical storage data of logical "0" and that of logical "1" are created for the word line WL.

As illustrated in FIG. 5C, the level difference between the two threshold voltages of the word line WL is used to perform reading by a sense amplifier. When the voltage applied to the first gate conductor layer 5a connected to the plate line PL is set to a voltage higher than the threshold voltage at the time of logical storage data "1" and lower than the threshold voltage at the time of logical storage data "0" in reading of logical storage data "0", a property that a current does not flow even when the voltage of the word line WL is increased can be attained.

Figure 6A:
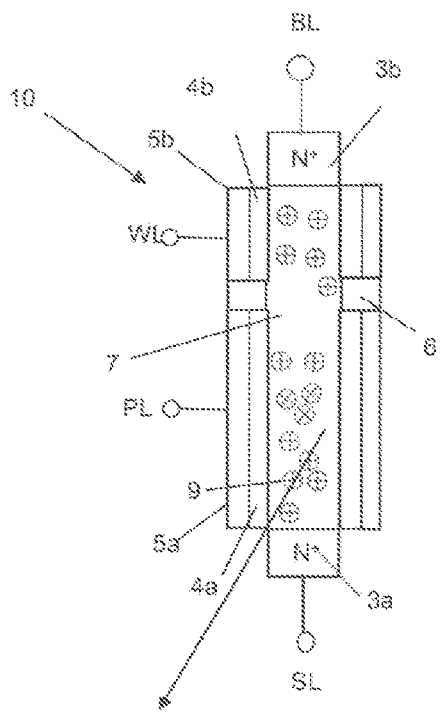
FIGS. 6AA and 6AB are diagrams for explaining a block refresh operation of the SGT-including memory device for a "1" write state according to the first embodiment.
Figure 6A:
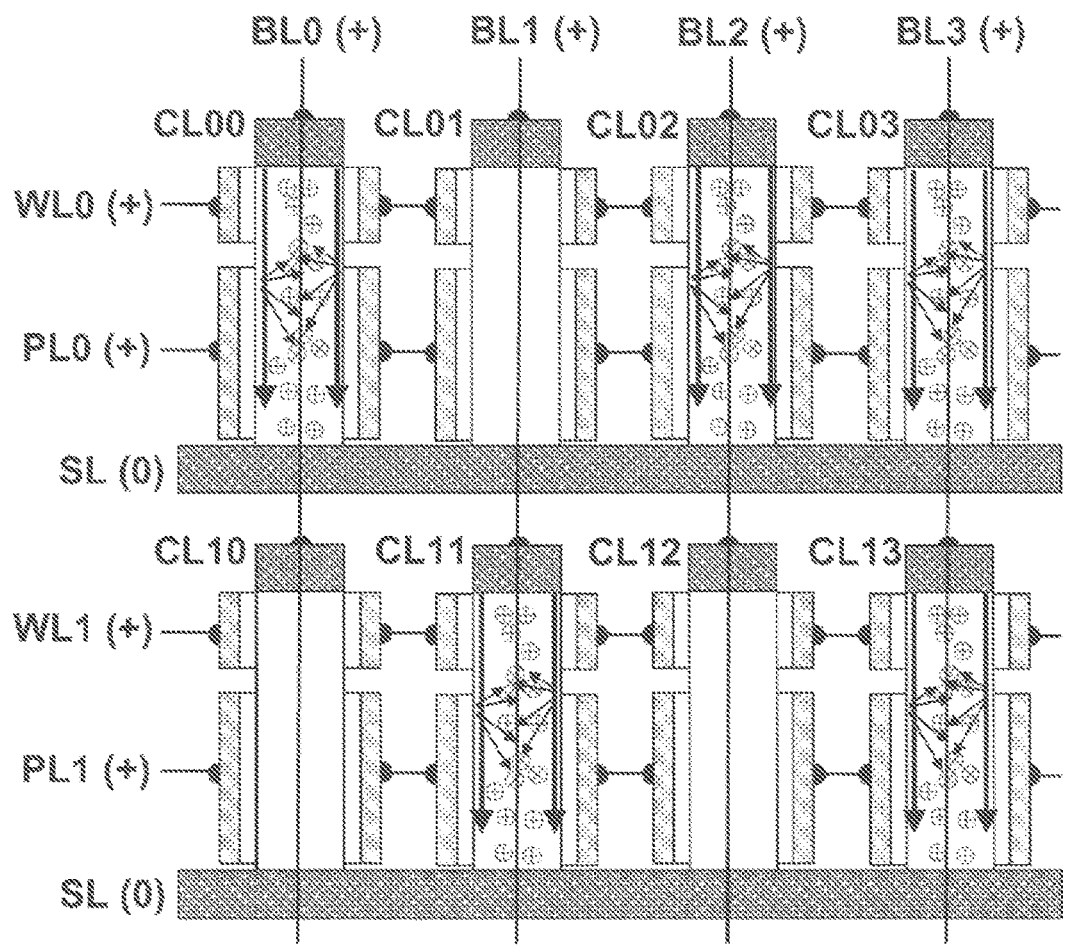

FIGS. 6AA, 6AB, 6BC and 6BD are diagrams for explaining a block refresh operation for the dynamic flash memory cells in a "1" write state according to the first embodiment of the present invention.

Figure 6B:
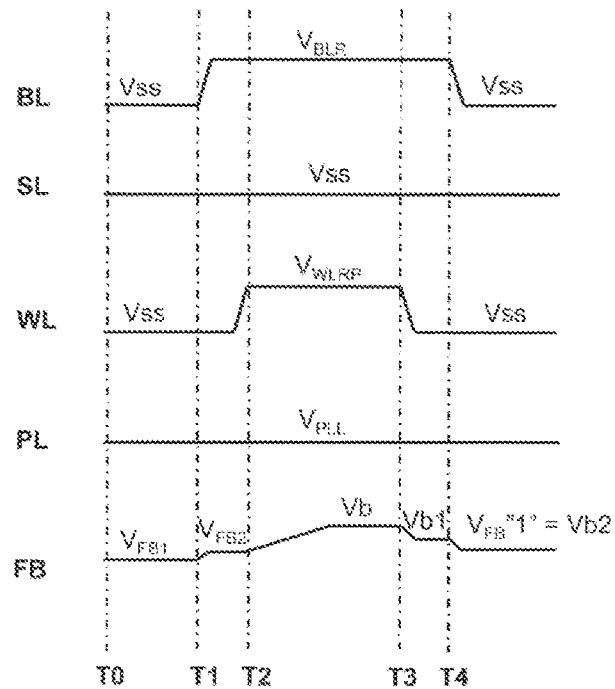
FIGS. 6BC and 6BD are diagrams for explaining the block refresh operation of the SGT-including memory device for the "1" write state according to the first embodiment.
Figure 6B:
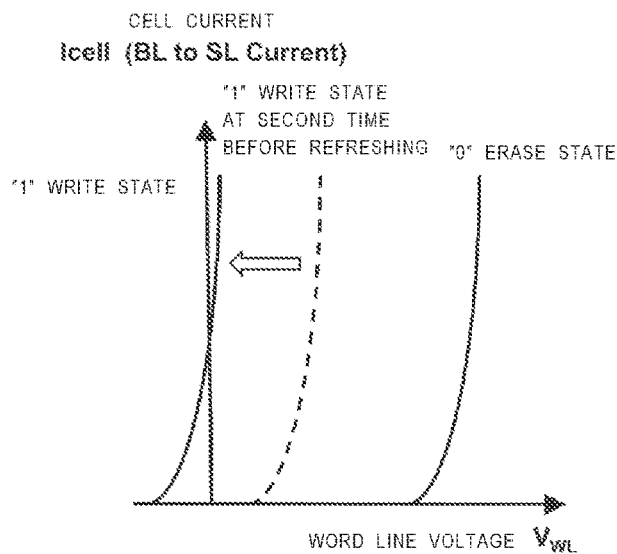

FIG. 6AA illustrates a single dynamic flash memory cell constituted by a single semiconductor body and in a "1" write state. Although the initial voltage of the semiconductor body 7 to which "1" is written is equal to $V_{FB}$"1", the voltage changes over time and drops to $V_{FB}$"1"–Vα. This is caused by a leak current of the group of positive holes 9 from the semiconductor body 7, that is, for example, a leak current to the source N⁺ layer 3a and to the drain N⁺ layer 3b. FIG. 6AB illustrates eight dynamic flash memory cells CL00 to CL13 that constitute a part of the same block ("which is an example of "block" in the claims) in which a plurality of semiconductor bodies are arranged in a matrix. Here, the dynamic flash memory cells CL00, CL02, CL03, CL11, and CL13 are in a "1" write state at a first time (which is an example of "first time" in the claims) and the group of positive holes 9 are excessively retained in the semiconductor body 7. The dynamic flash memory cells CL01, CL10, and CL12 are in a "0" erase state and no excessive group of positive holes 9 are retained in the semiconductor body 7. To perform refreshing, which is a memory re-write operation (which is an example of "memory re-write operation" in the claims), for the dynamic flash memory cells CL00, CL02, CL03, CL11, and CL13 in the "1" write state, a positive bias is applied to bit lines BL0 to BL3, to word lines WL0 and WL1, and to plate lines PL0 and PL1, and a source line SL is kept at Vss. Here, Vss is equal to, for example, 0 V. Specific examples of the operation waveforms are illustrated in FIG. 6BC, which illustrates changes in the voltages of the bit line BL, the source line SL, the word line WL, the plate line PL, and the semiconductor body 7 that functions as the floating body FB, over time from time T0 to time T4. At time T0, which is a second time (which is an example of "second time" in the claims), the voltage of the semiconductor body 7 of the dynamic flash memory cell in the "1" write state drops to $V_{FB1}=V_{FB}$"1"–Vα. At time T1, the voltage of the bit line BL rises from Vss to $V_{BLR}$. Here, $V_{BLR}$ is a voltage of the bit line BL for the block refresh operation for the "1" write state and is equal to, for example, 2 V. As a result, due to capacitive coupling at the PN junction between the drain layer 3b and the P-layer semiconductor body 7, when the coupling ratio of capacitive coupling between the bit line BL and the semiconductor body 7 is denoted by $\beta_{BL}$, the voltage $V_{FB2}$ of the semiconductor body 7 is expressed by expression (10) by using expression (4).

$$\beta_{BL}=C_{VL}/(C_{WL}+C_L+C_{BL}+C_{SL}) \quad (4)$$

$$V_{FB2}=V_{FB1}\beta_{BL}\times V_{BLR} \quad (10)$$

The description of the block refresh operation for the dynamic flash memory cells in the "1" write state according to the first embodiment of the present invention will be continued with reference to FIG. 6BC. At time T2, the word line WL rises from Vss to a high voltage of $V_{WLRP}$. Here, $V_{WLRP}$ is a voltage applied to the word line WL for the block refresh operation for the "1" write state and is equal to, for example, 4 V. As a result, in the dynamic flash memory cells CL00, CL02, CL03, CL11, and CL13 in the "1" write state, the first N-channel MOS transistor region that is a region in which the first gate conductor layer 5a to which the plate line PL0 or PL1 is connected surrounds the semiconductor body 7 operates in the saturation region, and the second N-channel MOS transistor region that is a region in which the second gate conductor layer 5b to which the word line WL0 or WL1 is connected surrounds the channel layer 7 operates in the linear region. Accordingly, a current flows from the drain N⁺ layer 3b to the source N⁺ layer 3a, and the group of positive holes 9 are generated by an impact ionization phenomenon, with which the semiconductor body 7 is filled. As a result, the voltage of the semiconductor body 7 becomes equal to the built-in voltage Vb (about 0.7 V). In contrast, in the dynamic flash memory cells CL01, CL10, and CL12 that are in the "0" erase state, the threshold voltage $Vt_{PL}$"0" in the "0" erase state of the first N-channel MOS transistor region that is a region in which the first gate conductor layer 5a to which the plate line PL0 or PL1 is connected surrounds the channel layer 7 and the threshold voltage $Vt_{WL}$"0" in the "0" erase state of the second N-channel MOS transistor region that is a region in which the second gate conductor layer 5b to which the word line WL0 or WL1 is connected surrounds the channel layer 7 are high, and therefore, a current does not flow from the drain N⁺ layer 3b to the source N⁺ layer 3a at time T2 and an impact ionization phenomenon does not occur, The description of the block refresh operation for the dynamic flash memory cells in the "1" write state according to the first embodiment of the present invention will be continued with reference to FIG. 6BC. At time T3, the word line WL drops from $V_{WLRP}$ to Vss. The inversion layer 12b is generated in the channel layer 7 surrounded by the second gate conductor layer 5b to which the word line WL is connected, and this inversion layer interrupts second capacitive coupling between the second gate conductor layer 5b and the channel layer 7. When the threshold voltage in the "1" write state of the second N-channel MOS transistor region that is a region in which the second gate conductor layer 5b surrounds the channel layer 7 is denoted by $Vt_{WL}$"1", the second capacitive coupling between the second gate conductor layer 5b and the channel layer 7 works when the voltage of the word line WL drops to $Vt_{WL}$"1" or below, and the voltage of the semiconductor body 7 becomes equal to Vb1 expressed by expression (11).

$$Vb1=Vb-\beta_{WL}\times Vt_{WL}\text{"1"} \quad (11)$$

Here, the threshold voltage $Vt_{WL}$"1" in the "1" write state is low, and therefore, $\beta_{WL}\times Vt_{WL}$"1" is small. Subsequently, at time T4, the bit line BL drops from $V_{SLR}$ to Vss, and the block refresh operation for the "1" write state ends. The voltage $V_{FB}$"1" of the semiconductor body 7 becomes equal to Vb2 expressed by expression (12) at the end.

$$V_{FB}\text{"1"} = Vb2 = Vb1 - \beta_{BL} \times V_{BLR} \quad (12)$$
$$= Vb - \beta_{WL} \times Vt_{WL}\text{"1"} - \beta_{BL} \times V_{BLR}$$

Therefore, as illustrated in FIG. 6BD, in the graph showing the relationship between the word line voltage $V_{WL}$ and the cell current Icell, the threshold voltage $Vt_{WL}$ of the second N-channel MOS transistor region that is a region in which the second gate conductor layer 5b surrounds the channel layer 7 decreases from that in the "1" write state before refreshing represented by a dashed line to that in the "1" write state represented by a solid line.

Figure 7A:
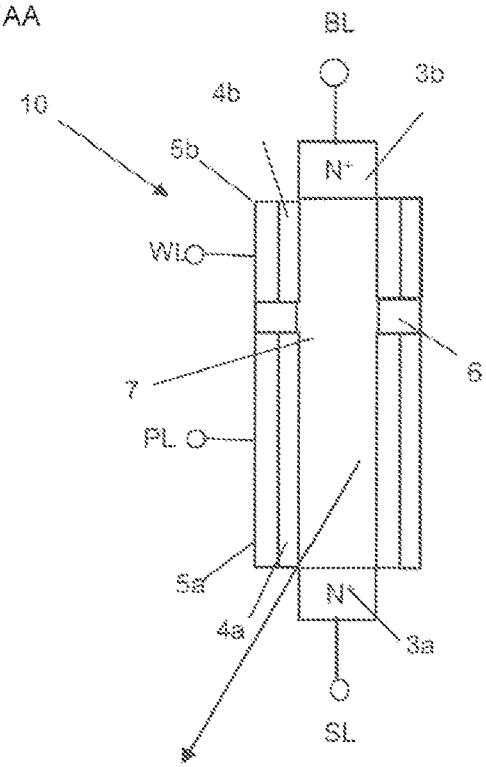
FIGS. 7AA and 7AB are diagrams for explaining a block refresh operation of the SGT-including memory device for a "0" erase state according to the first embodiment.
Figure 7A:
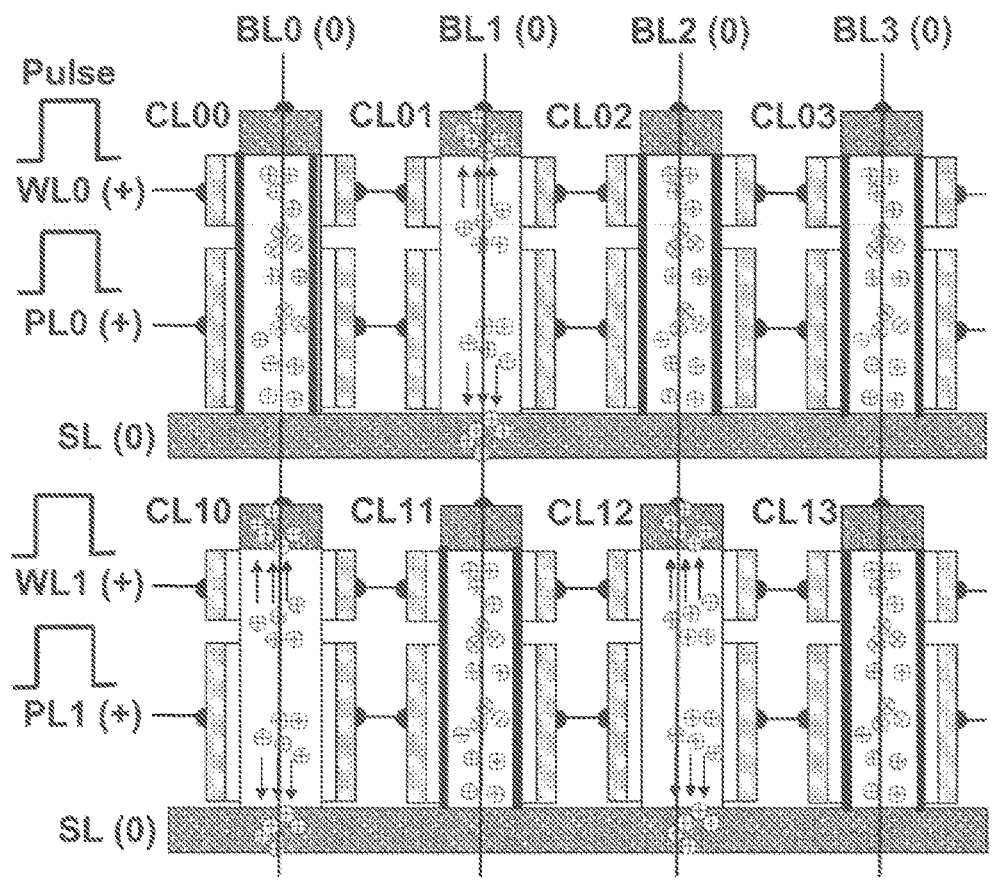

FIGS. 7AA, 7AB, 7BC and 7BD are diagrams for explaining a block refresh operation for the dynamic flash memory cells in a "0" erase state according to the first embodiment of the present invention.

FIG. 7AA illustrates a single dynamic flash memory cell in a "0" erase state. Although the initial voltage of the semiconductor body 7 to which "0" is written is equal to $V_{FB}\text{"0"}$ at the first time, the voltage changes over time and rises to $V_{FB}\text{"0"}+V\gamma$ at a third time (which is an example of "third time" in the claims). This is caused by a leak current of, for example, the group of positive holes 9 flowing into the semiconductor body 7. FIG. 7AB illustrates the eight dynamic flash memory cells CL00 to CL13 that constitute a part of the same block. Here, the dynamic flash memory cells CL00, CL02, CL03, CL11, and CL13 are in a "1" write state and the group of positive holes 9 are excessively retained in the semiconductor body 7, and the dynamic flash memory cells CL01, CL10, and CL12 are in a "0" erase state and no excessive group of positive holes 9 are retained in the semiconductor body 7. To perform refreshing, which is a memory re-erase operation (which is an example of "memory re-erase operation" in the claims), for the dynamic flash memory cells CL01, CL10, and CL12 in the "0" erase state, a positive-bias pulse is applied to the word lines WL0 and WL1 and to the plate lines PL0 and PL1 while the bit lines BL0 to BL3 and the source line SL are kept at Vss. Here, Vss is equal to, for example, 0 V. Specific examples of the operation waveforms are illustrated in FIG. 7BC, which illustrates changes in the voltages of the bit line BL, the source line SL, the word line WL, the plate line PL, and the semiconductor body 7 that functions as the floating body FB, over time from time T0 to time T2.

At time T0, the voltage of the semiconductor body 7 of the dynamic flash memory cell in the "0" erase state rises to $V_{FB3}=V_{FB}\text{"0"}+V\gamma$. When the word line WL rises from Vss to $V_{WLRE}$ and the plate line PL rises from $V_{PLL}$ to $V_{PLR}$ at time T1, due to second capacitive coupling between the second gate conductor layer 5b to which the word line WL is connected and the channel layer 7 and first capacitive coupling between the first gate conductor layer 5a to which the plate line PL is connected and the channel layer 7, the voltage of the channel layer 7 becomes equal to $V_{FB4}$ that is higher than the built-in voltage Vb. As a result, in the dynamic flash memory cells CL01, CL10, and CL12 in the "0" erase state, the PN junction between the P-layer semiconductor body 7 and the source $N^+$ layer 3a and the PN junction between the P-layer semiconductor body 7 and the drain $N^+$ layer 3b are forward biased, and the group of positive holes 9 having flowed into the semiconductor body 7 are discharged to the source $N^+$ layer 3a and to the drain $N^+$ layer 3b. In the dynamic flash memory cells CL00, CL02, CL03, CL11, and CL13 in the "1" write state, the inversion layer 12a is formed in the semiconductor body 7 surrounded by the first gate conductor layer 5a to which the plate line PL is connected and the inversion layer 12b is formed in the semiconductor body 7 surrounded by the second gate conductor layer 5b to which the word line WL is connected. Both the bit line BL and the source line SL are kept at Vss, and therefore, a current does not flow from the bit line BL to the source line SL and an impact ionization phenomenon does not occur. Further, the inversion layers 12a and 12b shield the first gate conductor layer 5a and the second gate conductor layer 5b from the semiconductor body 7, and therefore, the voltage of the semiconductor body 7 does not rise.

Figure 7B:
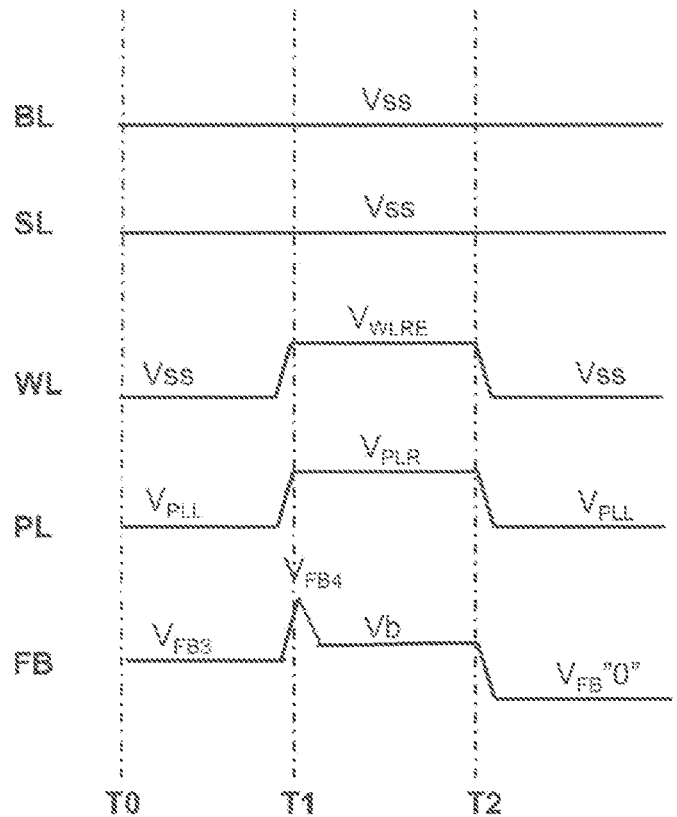
FIGS. 7BC and 7BD are diagrams for explaining the block refresh operation of the SGT-including memory device for the "0" erase state according to the first embodiment.
Figure 7B:
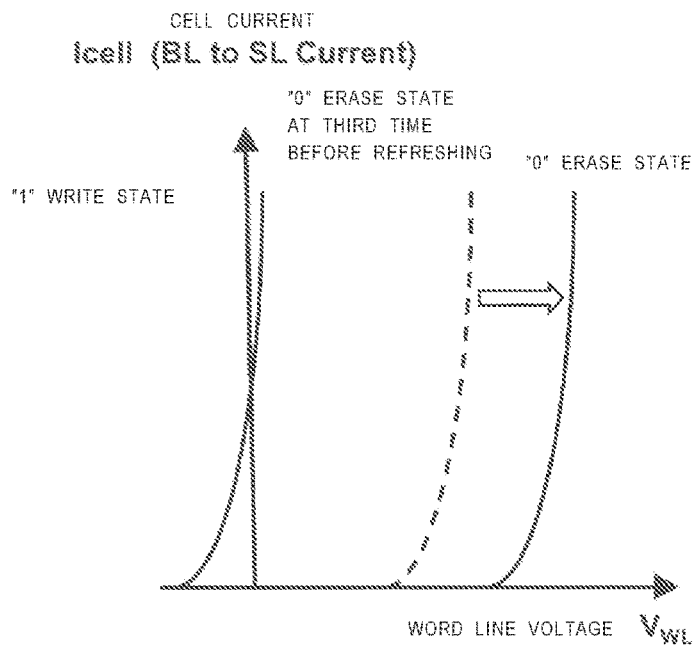

The description of the block refresh operation for the dynamic flash memory cells in the "0" erase state according to the first embodiment of the present invention will be continued with reference to FIG. 7BC. When the voltage of the word line WL drops from $V_{WLRE}$ to Vss and the voltage of the plate line PL drops from $V_{PLR}$ to $V_{PLL}$ at time T2, the voltage $V_{FB}=\text{"0"}$ of the semiconductor body 7 of the dynamic flash memory cell in the "0" erase state after the refresh operation is expressed by expression (13).

$$V_{FB}\text{"0"}=Vb-\beta_{WL}\times V_{WLRE}-\beta_{PL}\times(V_{PLR}-V_{PLL}) \quad (13)$$

Therefore, as illustrated in FIG. 7BD, in the graph showing the relationship between the word line voltage $V_{WL}$ and the cell current Icell, the threshold voltage $Vt_{WL}\text{"0"}$ of the second N-channel MOS transistor region that is a region in which the second gate conductor layer 5b surrounds the channel layer 7 increases from that in the "0" erase state at the third time before refreshing represented by a dashed line to that in the "0" erase state represented by a solid line. Therefore, when the voltage applied to the first gate conductor layer 5a connected to the plate line PL is set to a voltage higher than the threshold voltage at the time of logical storage data "1" and lower than the threshold voltage at the time of logical storage data "0" in reading of logical storage data "0", a property that a current does not flow even when the voltage of the word line WL is increased can be attained.

Note that in FIG. 1, it is desirable to make the length of the first gate conductor layer 5a, in the vertical direction, to which the plate line PL is connected further longer than the length of the second gate conductor layer 5b, in the vertical direction, to which the word line WL is connected to attain $C_{PL}>C_{WL}$. However, when only the plate line PL is added, the coupling ratio $(C_{WL}/(C_{PL}+C_{WL}+C_{BL}+C_{SL}))$, of capacitive coupling, of the word line WL to the semiconductor body 7 decreases. As a result, the potential change $\Delta V_{FB}$ of the semiconductor body 7 that is a floating body decreases.

As the voltage $V_{PLL}$ of the plate line PL, a fixed voltage of, for example, 2 V may be applied in operation modes other than a mode in which selective erasing is performed in a block erase operation.

Regardless of whether the cross-sectional shape of the Si column 2 illustrated in FIG. 1 is a round shape, an elliptic shape, or a rectangular shape, the operations of the dynamic flash memory described in this embodiment can be performed. Further, a dynamic flash memory cell having a round shape, a dynamic flash memory cell having an elliptic shape, and a dynamic flash memory cell having a rectangular shape may coexist on the same chip.

With reference to FIG. 1, the dynamic flash memory element including, for example, an SGT in which the first gate insulator layer 4a and the second gate insulator layer 4b that surround the entire side surface of the Si column 2 standing on the substrate 1 in the vertical direction are provided and which includes the first gate conductor layer 5a and the second gate conductor layer 5b that entirely surround the first gate insulator layer 4a and the second gate insulator layer 4b has been described. As described in this embodiment, the dynamic flash memory element needs to have a structure that satisfies the condition that the group of positive holes 9 generated by an impact ionization phenomenon are retained in the semiconductor body 7. For this, the semiconductor body 7 needs to have a floating body structure isolated from the substrate 1. Accordingly, even when the semiconductor body is formed horizontally along the substrate 1 by using, for example, GAA (Gate All Around, see, for example, J. Y. Song, W. Y. Choi, J. H. Park, J. D. Lee, and B-G. Park: "Design Optimization of Gate-All-Around (GAA) MOSFETs" IEEE Trans. Electron Devices, vol. 5, no. 3, pp. 186-191, May 2006) technology, which is one type of SGT, or nanosheet technology (see, for example, N. Loubet, et al.: "Stacked Nanosheet Gate-All-Around Transistor to Enable Scaling Beyond FinFET", 2017 IEEE Symposium on VLSI Technology Digest of Technical Papers, T17-5, T230-T231, June 2017), the above-described operations of the dynamic flash memory can be performed. Alternatively, the dynamic flash memory element may have a device structure using SOI (Silicon On Insulator) (see, for example, J. Wan, L. Rojer, A. Zaslavsky, and S. Critoloveanu: "A Compact Capacitor-Less High-Speed DRAM Using Field Effect-Controlled Charge Regeneration", Electron Device Letters, Vol. 35, No. 2, pp. 179-181 (2012), T. Ohsawa, K. Fujita, T. Higashi, Y. Iwata, T. Kajiyama, Y. Asao, and K. Sunouchi: "Memory design using a one-transistor gain cell on SOI", IEEE JSSC, vol. 37, No. 11, pp. 1510-1522 (2002), T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond", IEEE IEDM (2006), and E. Yoshida: "A Capacitorless 1T-DRAM Technology Using Gate-Induced Drain Leakage (GIDL) Current for Low-Power and High-Speed Embedded Memory", IEEE IEDM (2006)). In this device structure, the bottom portion of the semiconductor body is in contact with an insulating layer of the SOI substrate, and the other portion of the semiconductor body is surrounded by a gate insulator layer and an element isolation insulating layer. With such a structure, the semiconductor body also has a floating body structure.

Accordingly, the dynamic flash memory element provided in this embodiment needs to satisfy the condition that the semiconductor body has a floating body structure. Even with a structure in which a Fin transistor (see, for example, H. Jiang, N. Xu, B. Chen, L. Zengl, Y. He, G. Du, X. Liu and X. Zhang: "Experimental investigation of self-heating effect (SHE) in multiple-fin SOI FinFETs", Semicond. Sci. Technol. 29 (2014) 115021 (7pp)) is formed on an SOI substrate, as long as the semiconductor body has a floating body structure, the operations of the dynamic flash memory can be performed.

Note that in the specification and the claims, the meaning of "cover" in a case of "a gate insulator layer, a gate conductor layer, or the like covers a channel or the like" also includes a case of surrounding entirely as in an SGT or GAA, a case of surrounding except a portion as in a Fin transistor, and a case of overlapping a flat object as in a planar transistor.

Expressions (1) to (16) provided in the specification and in the drawings are expressions used to qualitatively explain the phenomena, and are not intended to limit the phenomena.

Although FIGS. 4AA, 4AB, 4BC, 4BD and 4BE illustrate example conditions of the erase operation, the voltages applied to the source line SL, the plate line PL, the bit line BL, and the word line WL may be changed as long as a state in which the group of positive holes 9 in the semiconductor body 7 are discharged through one or both of the $N^+$ layer 3a and the $N^+$ layer 3b can be attained.

In FIG. 1, in the vertical direction, in a part of the semiconductor body 7 surrounded by the insulating layer 6 that is the first insulating layer, the potential distribution of the first semiconductor body 7a and that of the second semiconductor body 7b are connected and formed. Accordingly, the first semiconductor body 7a and the second semiconductor body 7b that constitute the semiconductor body 7 are connected in the vertical direction in the region surrounded by the insulating layer 6 that is the first insulating layer.

In FIG. 1, the first gate conductor layer 5a may be divided into two or more gate conductor layers, and the gate conductor layers may each function as a conductive electrode of the plate line and may be operated synchronously or asynchronously at identical driving voltages or different driving voltages. Similarly, the second gate conductor layer 5b may be divided into two or more gate conductor layers, and the gate conductor layers may each function as a conductive electrode of the word line and may be operated synchronously or asynchronously at identical driving voltages or different driving voltages.

In this case, the operations of the dynamic flash memory can also be performed. In a case where the first gate conductor layer 5a is divided into two or more gate conductor layers, at least one of the first gate conductor layers obtained as a result of division assumes the roles of the first gate conductor layer 5a described above. In a case where the second gate conductor layer 5b is divided into two or more gate conductor layers, at least one of the second gate conductor layers obtained as a result of division assumes the roles of the second gate conductor layer 5b described above. In the vertical direction, isolated gate conductor layers obtained from one of the first gate conductor layer 5a or the second gate conductor layer 5b may be disposed on the respective sides of the other of the first gate conductor layer 5a or the second gate conductor layer 5b.

In FIG. 1, the first gate conductor layer 5a may be connected to the word line WL and the second gate conductor layer 5b may be connected to the plate line PL. In this case, the above-described operations of the dynamic flash memory can also be performed.

The above-described conditions of voltages applied to the bit line BL, the source line SL, the word line WL, and the plate line PL and the voltage of the floating body are examples for performing basic operations including the erase operation, the write operation, and the read operation, and other voltage conditions may be employed as long as the basic operations of the present invention can be performed.

Further, a junction-less structure in which the conductivities of the $N^+$ layers 3a and 3b and the P-layer semiconductor body 7 of the dynamic flash memory cell illustrated in FIG. 1 are made identical may be employed. The same applies to other embodiments.

This embodiment has the following features.

Feature 1

The dynamic flash memory cell of this embodiment is constituted by the N⁺ layers 3a and 3b that function as the source and the drain, the semiconductor body 7, the first gate insulator layer 4a, the second gate insulator layer 4b, the first gate conductor layer 5a, and the second gate conductor layer 5b, which are formed in a columnar form as a whole. The N⁺ layer 3a that functions as the source is connected to the source line SL, the N⁺ layer 3b that functions as the drain is connected to the bit line BL, the first gate conductor layer 5a is connected to the plate line PL, and the second gate conductor layer 5b is connected to the word line WL. A structure is employed in which the gate capacitance of the first gate conductor layer 5a to which the plate line PL is connected is larger than the gate capacitance of the second gate conductor layer 5b to which the word line WL is connected, which is a feature. In the dynamic flash memory cell, the first gate conductor layer and the second gate conductor layer are stacked in the vertical direction. Accordingly, even when the structure is employed in which the gate capacitance of the first gate conductor layer 5a to which the plate line PL is connected is larger than the gate capacitance of the second gate conductor layer 5b to which the word line WL is connected, the memory cell area does not increase in plan view.

Accordingly, a high-performance and highly integrated dynamic flash memory cell can be implemented.

Feature 2

In terms of the roles of the first gate conductor layer 5a to which the plate line PL is connected in the dynamic flash memory cell according to the first embodiment of the present invention, in the write operation and in the read operation performed by the dynamic flash memory cell, the voltage of the word line WL changes. At this time, the plate line PL assumes the role of decreasing the capacitive coupling ratio between the word line WL and the semiconductor body 7. As a result, an effect on changes in the voltage of the semiconductor body 7 when the voltage of the word line WL changes can be substantially suppressed. Accordingly, the difference between the threshold voltages of the transistor region of the word line WL indicating logical "0" and logical "1" can be increased. This leads to an increased operation margin of the dynamic flash memory cell. When the voltage applied to the first gate conductor layer 5a connected to the plate line PL is set to a voltage higher than the threshold voltage at the time of logical storage data "1" and lower than the threshold voltage at the time of logical storage data "0" in reading of logical data "0", a property that a current does not flow even when the voltage of the word line WL is increased can be attained.

This leads to a further increased operation margin of the dynamic flash memory cell.

Feature 3

The memory re-write operation and the memory re-erase operation, which are operations of refreshing the dynamic flash memory cells, according to the first embodiment of the present invention can be performed on a block-by-block basis, and this can make the time taken for refreshing significantly shorter than that for DRAMs. As a result, the duty ratio, which is the ratio of the time taken for refreshing to the time taken for usual operations other than refreshing, can be significantly improved.

Feature 4

When the memory re-write operation, which is an operation of refreshing the dynamic flash memory cells, according to the first embodiment of the present invention is performed on a block-by-block basis, the memory re-write operation is performed only for dynamic flash memory cells in the "1" write state and does not affect dynamic flash memory cells in the "0" erase state in the same block. In contrast, when the memory re-erase operation is performed on a block-by-block basis, the memory re-erase operation is performed only for dynamic flash memory cells in the "0" erase state and does not affect dynamic flash memory cells in the "1" write state in the same block. As a result, the memory re-write operation and the memory re-erase operation can be individually and efficiently performed for the entire selected block.

Second Embodiment

A block refresh operation of the SGT-including memory device according to a second embodiment will be described with reference to FIGS. 8A, 8B and 8C.

Figure 8A:
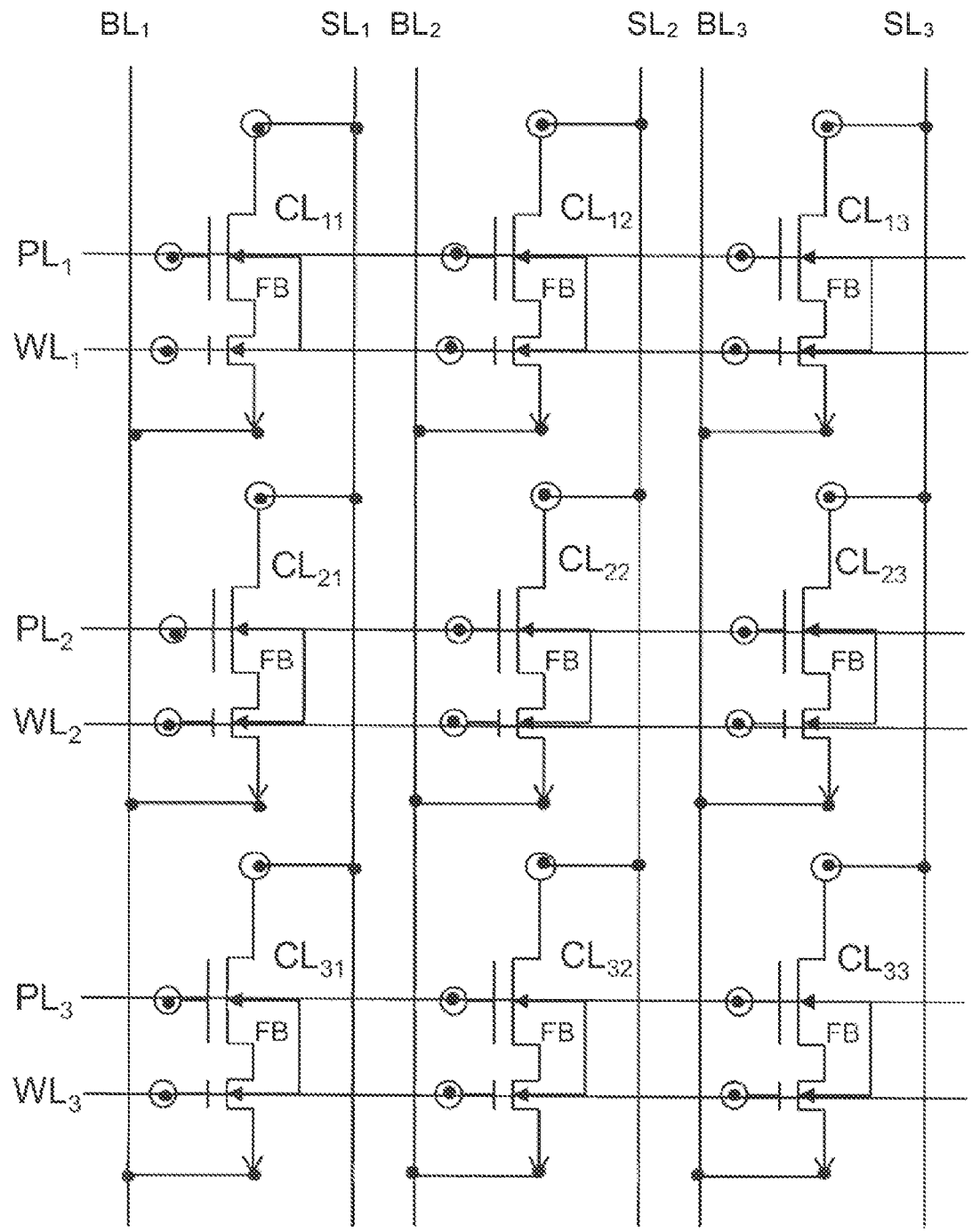
FIG. 8A is a circuit block diagram for explaining a block refresh operation of the SGT-including memory device according to a second embodiment.

FIG. 8A is a circuit diagram illustrating a memory block selected for block refreshing. Although nine memory cells $CL_{11}$ to $CL_{33}$ in three rows and three columns are illustrated, the actual memory block is larger than this matrix. To each memory cell, a corresponding one of the source lines $SL_1$ to $SL_3$, a corresponding one of the bit lines $BL_1$ to $BL_3$, a corresponding one of the plate lines $PL_1$ to $PL_3$, and a corresponding one of the word lines $WL_1$ to $WL_3$ are connected. As illustrated in FIG. 8B, to the bit lines $BL_1$ to $BL_3$ and the word lines $WL_1$ to $WL_3$ of a memory block selected for block refreshing for a "1" write state, the pulse waveforms as illustrated in FIG. 6BC are applied. For a block that is not refreshed, no pulse waveforms are applied. As illustrated in FIG. 8C, to the plate lines $PL_1$ to $PL_3$ and the word lines $WL_1$ to $WL_3$ of a memory block selected for block refreshing for a "0" erase state, the pulse waveforms as illustrated in FIG. 7BC are applied. For a block that is not refreshed, no pulse waveforms are applied.

Feature 1

For the dynamic flash memory cells in the second embodiment, block refreshing is performed for each of the blocks individually, and therefore, the bit line BL, the source line SL, the plate line PL, and the word line WL can be controlled for each of the blocks independently.

Feature 2

For the dynamic flash memory cells in the second embodiment, although the block refresh operation described with reference to FIGS. 6AA, 6AB, 6BC and FIG. 6BD is performed as in a flash memory, rewriting is performed with a low electric field far lower than that in a flash memory. Therefore, in terms of reliability, the limit of the number of rewrites for each block need not be specified.

Third Embodiment

FIGS. 9A, 9B to 9C are circuit block diagrams for explaining a block refresh operation for dynamic flash memory cells according to a third embodiment.

In FIG. 9A, a controller circuit 33 and a logical-physical block address conversion look-up table circuit (logical-physical address conversion table) 32 continuously manage a correspondence between data stored at a logical block address and a corresponding physical block address in the dynamic flash memory. This is because in a dynamic flash memory, in block data rewriting, a block that has already been erased is used to perform rewriting as in a flash memory, and therefore, the correspondence between the logical block address and the physical block address needs to be continuously managed. The controller circuit 33 and the logical-physical address conversion table 32 may be provided in the chip of the dynamic flash memory or may be provided outside the chip as illustrated in FIG. 9A. An order from the logical-physical address conversion table 32 is input to a block address decoder circuit 34, and a block to be refreshed is selected from among blocks BLK00 to BLK33.

In FIG. 9B, a case where an order for refreshing storage data in, for example, the block BLK21 among 16 blocks (4×4 blocks), namely, the blocks BLK00 to BLK33, of the dynamic flash memory is issued from the controller circuit 33 is assumed. The controller circuit 33 first refers to the logical-physical address conversion table 32 and specifies a block for which refreshing is necessary.

In FIG. 9C, a case where an order for refreshing storage data in, for example, three blocks BLK12, BLK21, and BLK32 among the 16 blocks (4×4 blocks), namely, the blocks BLK00 to BLK33, of the dynamic flash memory is issued from the controller circuit 33 is assumed. The controller circuit 33 first refers to the logical-physical address conversion table 32 and specifies blocks for which refreshing is necessary. As described above, a plurality of blocks can be selected and simultaneously refreshed.

In the block refresh operation described with reference to FIGS. 9A, 9B and 9C, a cache memory (not illustrated) that temporarily stores storage data in a block that is to be refreshed may be necessary. This cache memory may be provided inside or outside the chip of the dynamic flash memory of this embodiment.

The logical-physical address conversion table 32 or the cache memory may be constituted by a memory cell array that enables high-speed access to dynamic flash memory cells.

To retain storage data in blocks, a refresh operation for each block may be performed at the same time when another operation, namely, reading, writing, or erasing, is being performed for another block. In this case, refreshing is performed in the block at a physical address concerned, and therefore, a block rewrite operation need not be performed or a block erase operation need not be performed.

Feature 1

Although the dynamic flash memory cells in the third embodiment are volatile memory, a block rewrite operation and a block erase operation that are functions implemented only in a flash memory, which is nonvolatile memory, are implemented, and memory cells that allow higher integration can be provided.

Feature 2

For the dynamic flash memory cells in the third embodiment, a plurality of blocks can be selected upon a refresh operation and the refresh operation can be performed for the blocks simultaneously. All of the blocks in the chip of the dynamic flash memory can be simultaneously selected and the refresh operation can be performed. Accordingly, the refresh operation can be efficiently performed, and the time taken for the refresh operation can be significantly reduced.

Feature 3

For the dynamic flash memory cells in the third embodiment, a plurality of blocks can be selected upon a refresh operation and the refresh operation can be performed for the blocks simultaneously. At this time, the memory re-write operation can be performed for a first selected block and the memory re-erase operation can be performed for a second selected block simultaneously. Accordingly, the refresh operation can be efficiently performed, and the time taken for the refresh operation can be significantly reduced.

Fourth Embodiment

Figure 10A:
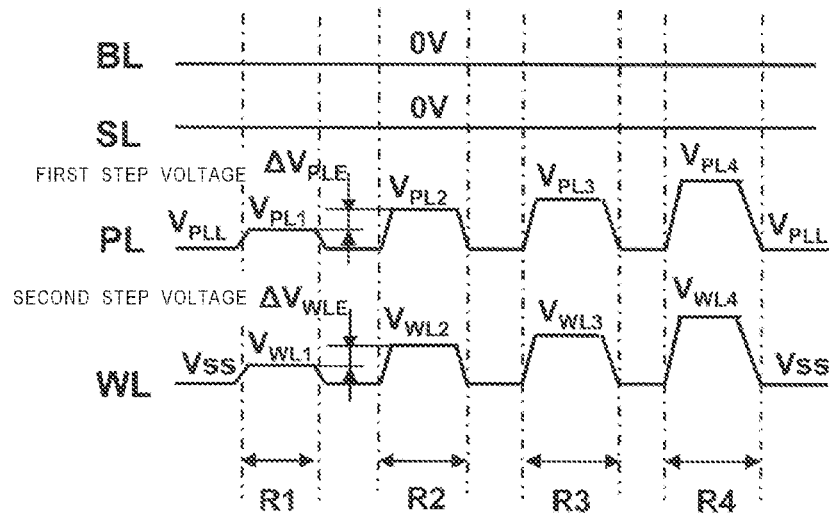
FIGS. 10AA and 10AB are diagrams for explaining a step-up refresh operation of the SGT-including memory device according to a fourth embodiment.
Figure 10A:
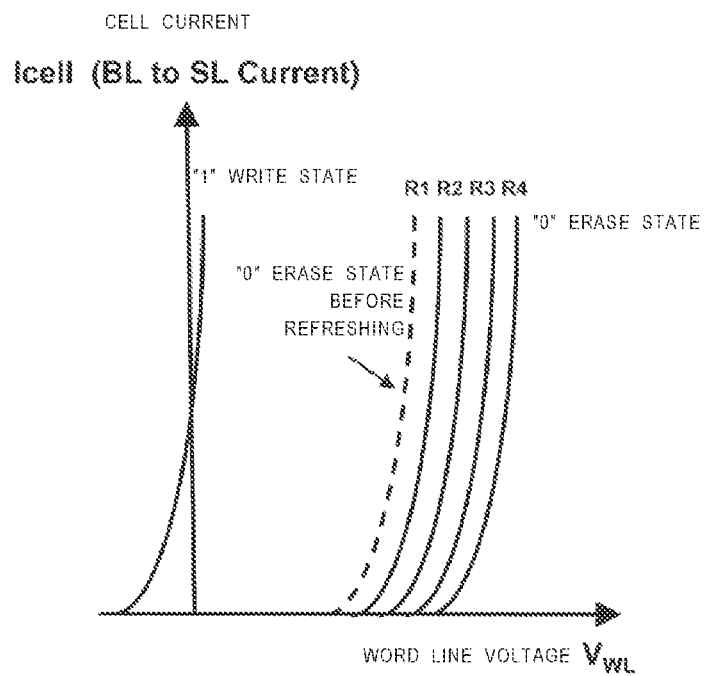

FIGS. 10AA, 10AB, and 10BC are diagrams for explaining a step-up refresh operation for the dynamic flash memory cell according to a fourth embodiment.

Figure 10B:
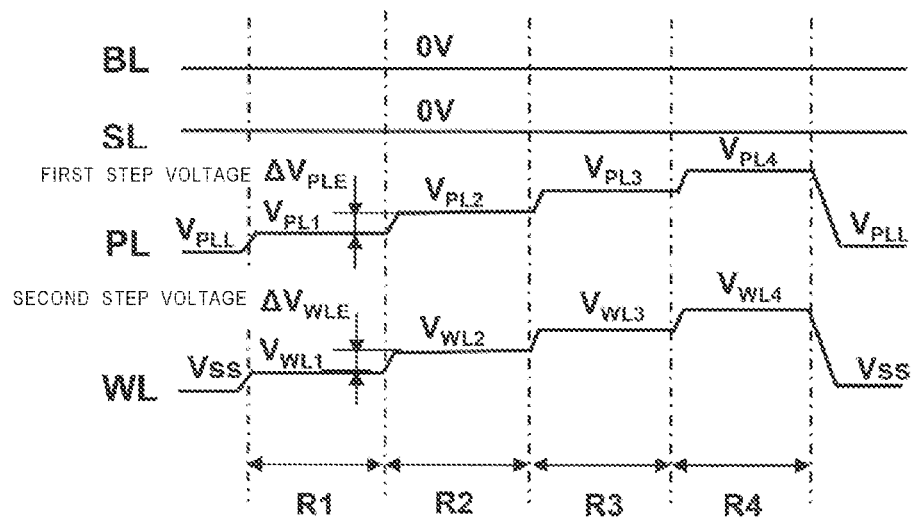
FIG. 10BC is a diagram for explaining the step-up refresh operation of the SGT-including memory device according to the fourth embodiment.
Figure 11A:
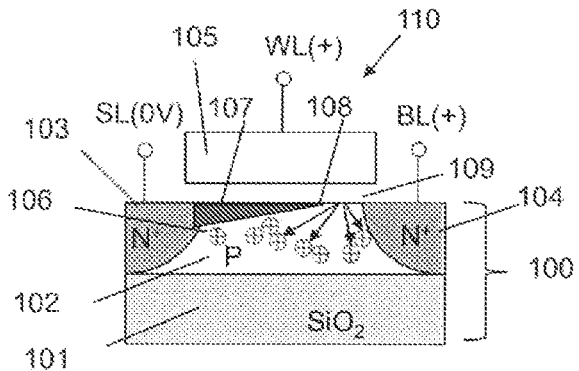
FIGS. 11A, 11B, 11C and 11D are diagrams for explaining a write operation of a DRAM memory cell including no capacitor in the related art.
Figure 11B:
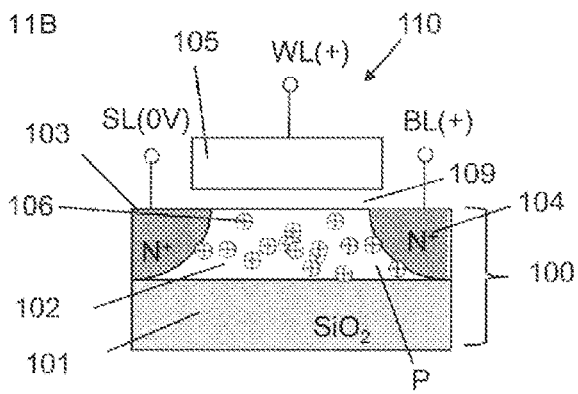
Figure 11C:
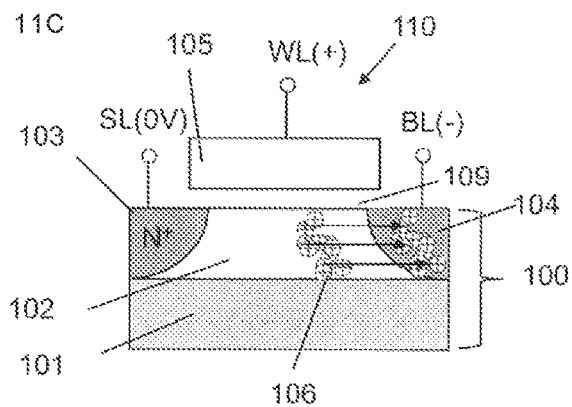
Figure 11D:
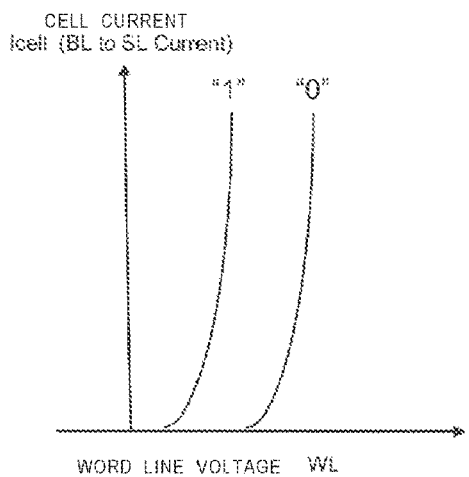
Figure 12A:
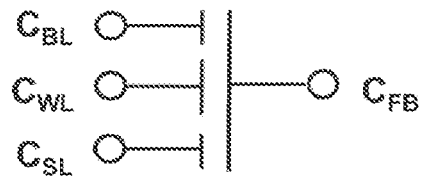
FIGS. 12A and 12B are diagrams for explaining a problem in the operation of the DRAM memory cell including no capacitor in the related art.
Figure 12B:
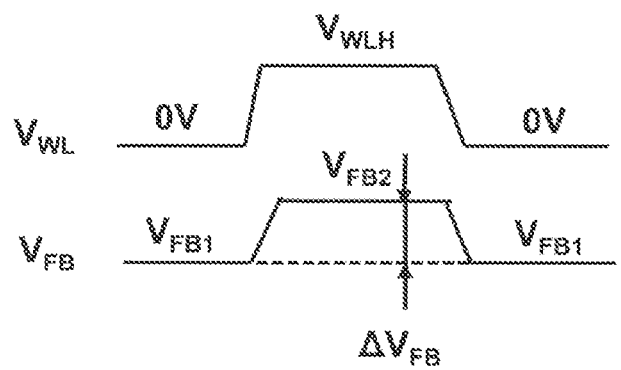
Figure 13A:
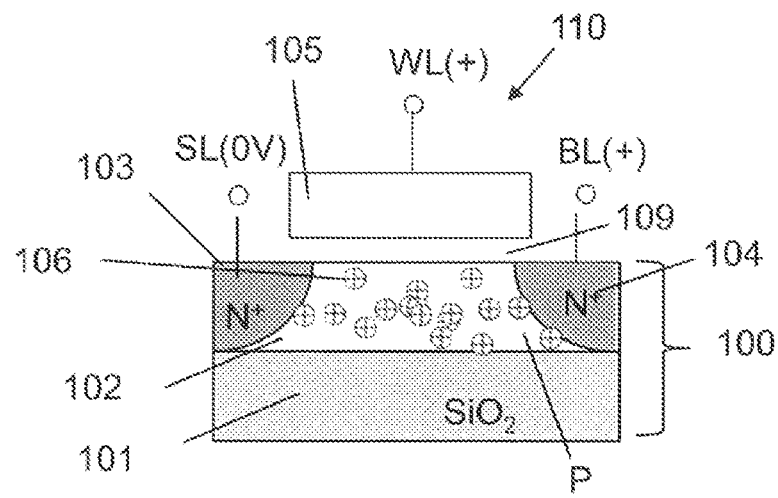
FIGS. 13A, 13B and 13C are diagrams for explaining a read operation of the DRAM memory cell including no capacitor in the related art.
Figure 13B:
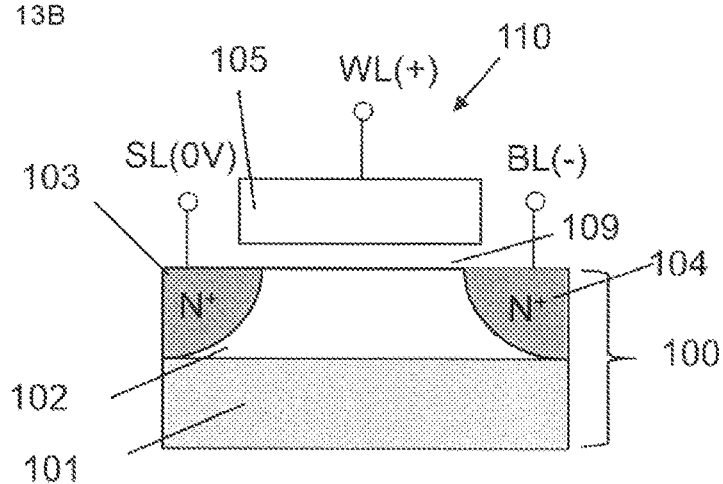
Figure 13C:
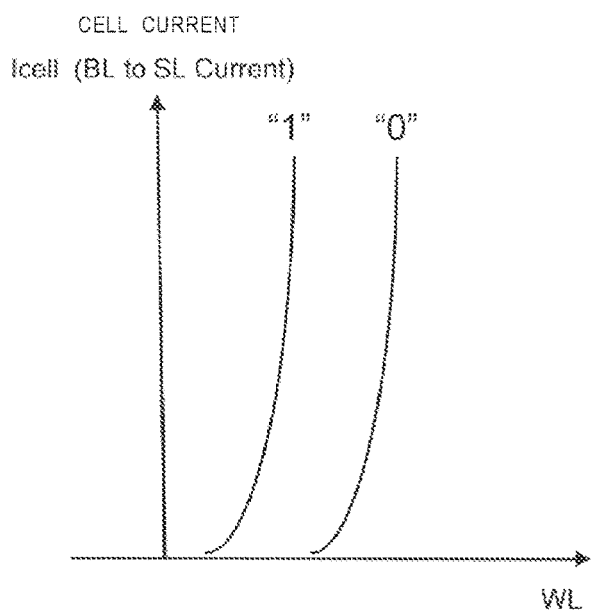

FIG. 10AA illustrates a case where the voltage of the plate line PL is increased from the first voltage $V_{PLL}$ to a second voltage $V_{PL4}$ in a memory re-erase operation such that the voltage is increased in increments of a first step voltage (which is an example of "first step voltage" in the claims) $\Delta V_{PLE}$ with a plurality of pulse waves. At this time, the voltage of the word line WL is increased from the third voltage Vss to a fourth voltage $V_{WL4}$ such that the voltage is increased in increments of a second step voltage (which is an example of "second step voltage" in the claims) $\Delta V_{WLE}$ with a plurality of pulse waves. FIG. 10AB illustrates a state in which the threshold voltage $Vt_{WL}$ "0" of the word line WL in a "0" erase state gradually rises in the step-up refresh operation. FIG. 10BC illustrates a case where the first step voltage and the second step voltage are not pulse waves and the voltage of the plate line PL and the voltage of the word line WL are successively increased without being decreased to low voltages of the first voltage and the third voltage respectively. When the step-up refresh operation as described above is performed, the voltages can be made closer to the desired voltages in the "0" erase state without a large electric field being applied to individual dynamic flash memory cells for which the refresh operation is performed.

Feature

For the dynamic flash memory cells in the fourth embodiment, even when a variation in the threshold voltage in the "0" erase state occurs in the same block at the third time, the variation can be resolved by performing the step-up refresh operation without application of an intense electric field. As a result, a highly reliable refresh operation can be performed.

Other Embodiments

Although the Si column is formed in the present invention, a semiconductor column made of a semiconductor material other than Si may be formed. The same applies to other embodiments according to the present invention.

The logical-physical address conversion table illustrated in FIGS. 9A, 9B and 9C in the third embodiment may be constituted by a dynamic flash memory that enables high-speed access to memory elements. The same applies to other embodiments according to the present invention.

Each of the blocks BLK00 to BLK33 illustrated in FIGS. 9A, 9B and 9C in the third embodiment may be provided with a timer circuit (not illustrated), and the blocks may be refreshed in accordance with instructions of the respective timer circuits. The same applies to other embodiments according to the present invention.

In a vertical NAND-type flash memory circuit, memory cells that are stacked in a plurality of tiers in the vertical direction and each of which is constituted by a semiconductor column, which functions as the channel, and a tunnel oxide layer, a charge storage layer, an interlayer insulating layer, and a control conductor layer that surround the semiconductor column are formed. At the semiconductor columns on both ends of these memory cells, a source line impurity region corresponding to the source and a bit line impurity region corresponding to the drain are disposed respectively. In addition, for one memory cell, when one of the memory cells on both sides of the one memory cell functions as the source, the other functions as the drain. Accordingly, the vertical NAND-type flash memory circuit is one type of SGT circuit. Therefore, the present invention is also applicable to a circuit in which a NAND-type flash memory circuit coexists.

To write "1", electron-positive hole pairs may be generated by an impact ionization phenomenon using a gate-induced drain leakage (GIDL) current described in E. Yoshida, and T. Tanaka: "A Capacitorless 1T-DRAM Technology Using Gate-Induced Drain-Leakage (GIDL) Current for Low-Power and High-Speed Embedded Memory", IEEE Transactions on Electron Devices, Vol. 53, No. 4, pp. 692-69, Apr. 2006, and the floating body FB may be filled with the generated group of positive holes. The same applies to other embodiments according to the present invention.

Even with a structure in which the polarity of the conductivity type of each of the $N^+$ layers $3a$ and $3b$ and the P-layer Si column 2 in FIG. 1 is reversed, the operations of the dynamic flash memory can be performed. In this case, in the Si column 2 that is of N-type, the majority carriers are electrons. Therefore, a group of electrons generated by impact ionization are stored in the semiconductor body 7, and a "1" state is set.

Various embodiments and modifications can be made to the present invention without departing from the spirit and scope of the present invention in a broad sense. The above-described embodiments are intended to explain examples of the present invention and are not intended to limit the scope of the present invention. Any of the above-described embodiments and modifications can be combined. Further, the above-described embodiments from which some of the configuration requirements are removed as needed are also within the scope of the technical spirit of the present invention.

With the semiconductor-element-including memory device according to the present invention, a high-density and high-performance dynamic flash memory that is an SGT-including memory device can be obtained.

What is claimed is:

1. A semiconductor element memory device comprising a block constituted by a plurality of memory cells arranged in a matrix on a substrate, each of the memory cells included in the block comprising:
   a semiconductor body formed to stand on the substrate in a vertical direction relative to the substrate or extend in a horizontal direction relative to the substrate;
   a first impurity region and a second impurity region formed to be disposed, respectively, at ends of the semiconductor body;
   a gate insulator layer formed in contact with a side surface of the semiconductor body between the first impurity region and the second impurity region;
   a first gate conductor layer formed to at least partially cover the gate insulator layer; and
   a second gate conductor layer formed adjacent to the first gate conductor layer in contact with a side surface of the gate insulator layer, wherein in each of the memory cells,
   voltages applied to the first gate conductor layer, the second gate conductor layer, the first impurity region, and the second impurity region are controlled to retain, inside the semiconductor body, a group of positive holes, which are generated by an impact ionization phenomenon or a gate-induced drain leakage current,
   a memory write operation is performed in which a voltage of the semiconductor body is made equal to a first data retention voltage that is higher than the voltage of one of the first impurity region or the second impurity region or the voltages of both of the first impurity region and the second impurity region by a built-in voltage,
   a memory erase operation is performed in which the voltage of the semiconductor body is controlled so as to be higher than the first data retention voltage with first capacitive coupling between the first gate conductor layer and the semiconductor body and second capacitive coupling between the second gate conductor layer and the semiconductor body, and a group of remaining positive holes among the group of positive holes are discharged from inside the semiconductor body through one or both of the first impurity region and the second impurity region until the voltage of the semiconductor body becomes equal to a voltage higher than the voltage of one of the first impurity region or the second impurity region or the voltages of both of the first impurity region and the second impurity region by the built-in voltage, and
   further wherein the voltage of the semiconductor body is made equal to a second data retention voltage lower than the first data retention voltage with the first capacitive coupling and the second capacitive coupling,
   the voltage of the semiconductor body in each of the plurality of memory cells in the block is equal to the first data retention voltage or the second data retention voltage at a first time,
   at a second time after a lapse of time since the first time, a memory re-write operation is performed for the semiconductor body, in the block, that is at a voltage equal to the first data retention voltage at the first time to return the voltage of the semiconductor body to a voltage close to the first data retention voltage, and
   at a third time after a lapse of time since the first time, a memory re-erase operation is performed for the semiconductor body, in the block, that is at a voltage equal to the second data retention voltage at the first time to return the voltage of the semiconductor body to a voltage close to the second data retention voltage.

2. The semiconductor element memory device according to claim 1, wherein the voltage of the first gate conductor layer is increased from a first voltage to a second voltage higher than the first voltage, and the voltage of the second gate conductor layer is increased from a third voltage to a fourth voltage higher than the third voltage, the memory re-erase operation is performed over a first period, a second period, and a third period, in the first period, the voltage of the semiconductor body is controlled so as to be higher than the voltage at the first time with the first capacitive coupling and the second capacitive coupling, in the second period, the group of remaining positive holes among the group of positive holes are discharged from inside the semiconductor body through one or both of the first impurity region and the second impurity region until the voltage of the semiconductor body becomes equal to a voltage higher than the voltage of one of the first impurity region or the second impurity region or the voltages of both of the first impurity region and the second impurity region by the built-in voltage, and in the third period, the voltage of the semiconductor body is made equal to a voltage close to the second data retention voltage lower than the first data retention voltage with the first capacitive coupling and the second capacitive coupling.

3. The semiconductor element memory device according to claim 2, wherein the voltage of the first gate conductor layer is increased from the first voltage to the second voltage in increments of a first step voltage in at least two steps, the voltage of the second gate conductor layer is increased from the third voltage to the fourth voltage in increments of a second step voltage in at least two steps, and the memory re-erase operation is performed.

4. The semiconductor element memory device according to claim 1, wherein in the memory re-write operation, an inversion layer is formed in the semiconductor body, in the same block, that is at a voltage equal to the first data retention voltage at the first time, and the semiconductor body is kept at a voltage close to the first data retention voltage.

5. The semiconductor element memory device according to claim 1, wherein in the memory re-erase operation, in the semiconductor body, in the same block, that is at a voltage equal to the second data retention voltage at the first time, a current does not flow between the first impurity region and the second impurity region, and the semiconductor body is kept at a voltage close to the second data retention voltage.

6. The semiconductor element memory device according to claim 1, wherein a first gate capacitance between the first gate conductor layer and the semiconductor body is larger than a second gate capacitance between the second gate conductor layer and the semiconductor body.

7. A semiconductor element memory device comprising a group of blocks that are a plurality of blocks each of which is the block of the semiconductor element memory device according to claim 1, wherein the first impurity region is connected to a source line, the second impurity region is connected to a bit line, one of the first gate conductor layer or the second gate conductor layer is connected to a word line, and the other of the first gate conductor layer or the second gate conductor layer is connected to a first driving control line, the source line is connected to the semiconductor bodies in each of the blocks, and voltages are applied to the source line, the bit line, the first driving control line, and the word line to perform one of the memory re-write operation or the memory re-erase operation for all of the semiconductor bodies in a block selected from among the group of blocks or simultaneously perform both of the memory re-write operation and the memory re-erase operation for all of the semiconductor bodies in respective blocks selected from among the group of blocks.

8. The semiconductor element memory device according to claim 1, wherein one or both of the first gate conductor layer and the second gate conductor layer is divided into two or more isolated gate conductor layers in plan view or in the vertical direction, and the isolated gate conductor layers are operated synchronously or asynchronously.

9. The semiconductor element memory device according to claim 8, wherein in the vertical direction, the isolated gate conductor layers obtained from one of the first gate conductor layer or the second gate conductor layer are disposed on respective sides of the other of the first gate conductor layer or the second gate conductor layer.

* * * * *